(12) United States Patent
Choi et al.

(10) Patent No.: US 12,506,061 B2
(45) Date of Patent: Dec. 23, 2025

(54) EMBEDDED TRACE SUBSTRATE ASSEMBLIES, AND RELATED MICROELECTRONIC DEVICE ASSEMBLIES, ELECTRONIC SYSTEMS, AND PROCESSES

(71) Applicant: Micron Technology, Inc., Boise, ID (US)

(72) Inventors: Bong Woo Choi, Singapore (SG); Venkateswarlu Bhavanasi, Singapore (SG); Naga Raju Sykam, Singapore (SG)

(73) Assignee: Micron Technology, Inc., Boise, ID (US)

(*) Notice: Subject to any disclaimer, the term of this patent is extended or adjusted under 35 U.S.C. 154(b) by 599 days.

(21) Appl. No.: 17/930,021

(22) Filed: Sep. 6, 2022

(65) Prior Publication Data

US 2024/0079305 A1 Mar. 7, 2024

(51) Int. Cl.
*H01L 23/00* (2006.01)
*H01L 21/48* (2006.01)
*H01L 23/498* (2006.01)
*H01L 25/065* (2023.01)

(52) U.S. Cl.
CPC .... *H01L 23/49838* (2013.01); *H01L 21/4846* (2013.01); *H01L 23/49827* (2013.01); *H01L 24/45* (2013.01); *H01L 24/48* (2013.01); *H01L 25/0652* (2013.01); *H01L 24/16* (2013.01); *H01L 2224/16227* (2013.01); *H01L 2224/45111* (2013.01); *H01L 2224/45116* (2013.01); *H01L 2224/45139* (2013.01); *H01L 2224/45144* (2013.01); *H01L 2224/45147* (2013.01); *H01L 2224/45164* (2013.01); *H01L 2224/48227* (2013.01)

(58) Field of Classification Search
CPC ........... H01L 23/49838; H01L 21/4846; H01L 23/49827; H01L 24/45; H01L 24/48; H01L 25/0652; H01L 24/16; H01L 2224/16227; H01L 2224/45111; H01L 2224/45116; H01L 2224/45139; H01L 2224/45144; H01L 2224/45147; H01L 2224/45164; H01L 2224/48227; H01L 23/49811; H01L 23/49816; H01L 23/49822; H01L 23/49805; H01L 23/49866; H01L 25/065; H10B 80/00
See application file for complete search history.

(56) References Cited

U.S. PATENT DOCUMENTS

2019/0043802 A1* 2/2019 Kapusta .............. H01L 21/4857

* cited by examiner

Primary Examiner — Elias Ullah
(74) Attorney, Agent, or Firm — TraskBritt

(57) ABSTRACT

An embedded trace substrate assembly includes a build-up lamination material with an upper surface on a die side and a board side. A solder-resist material on the die side defines a bond-wire section where bond-finger pads include a first lateral width top first and second plating materials are on the bond-finger pads. The top second plating material has a top surface that above the upper surface of the build-up lamination material. The wire-bond section includes a row of the bond-finger pads, the top first plating material and the top second plating material, and the solder-resist material is set back from a portion of the upper surface and from the bond-finger pads.

18 Claims, 14 Drawing Sheets

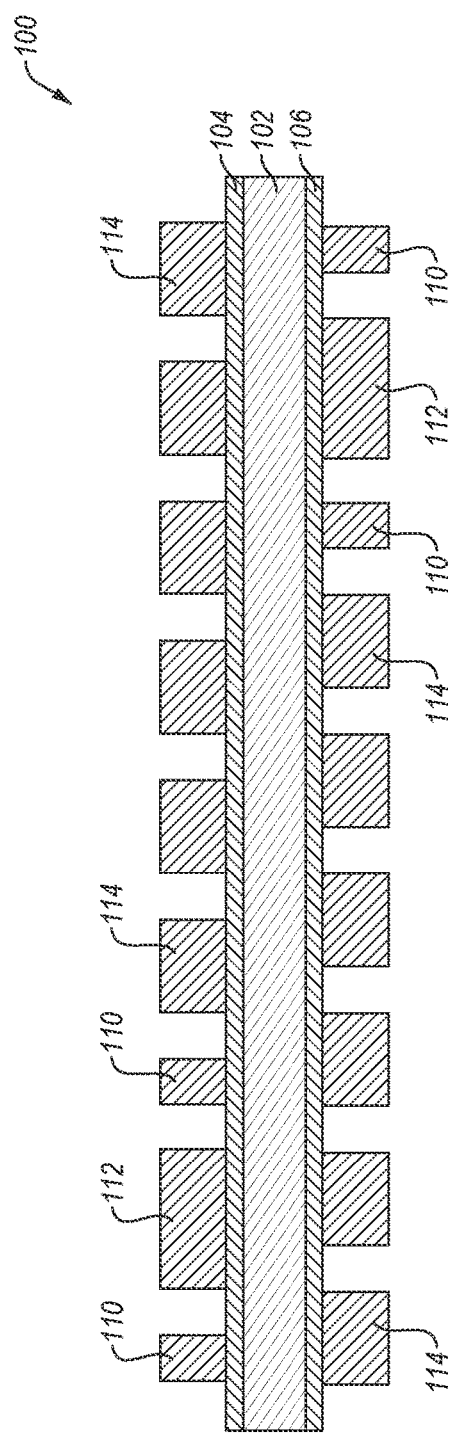
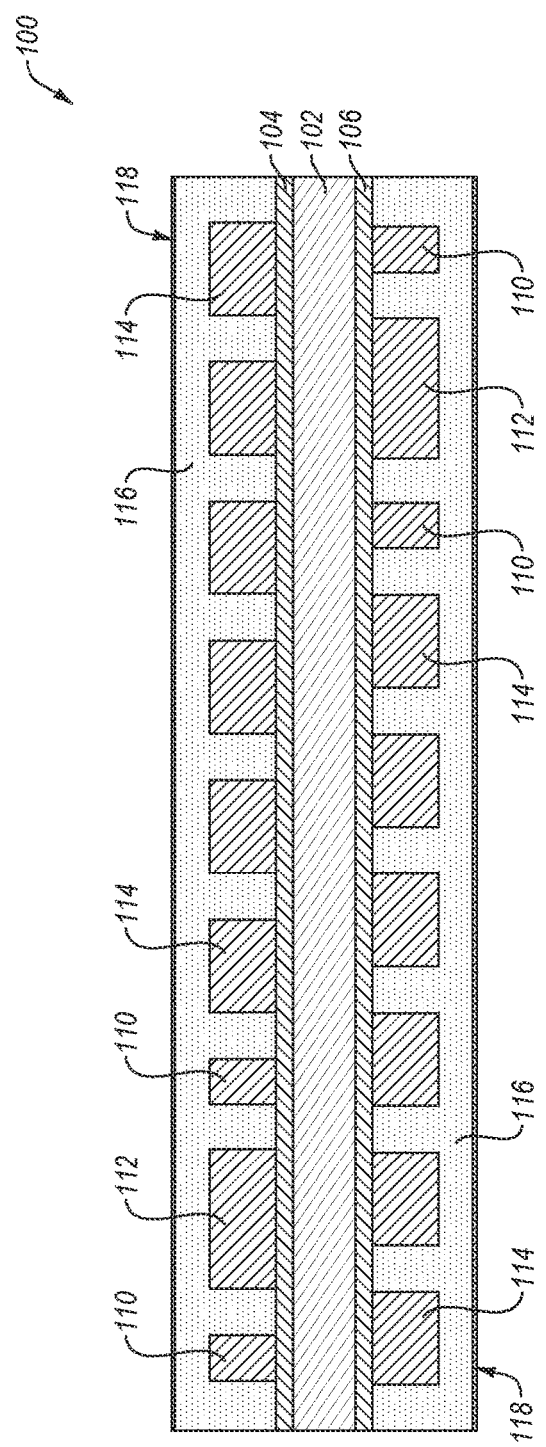

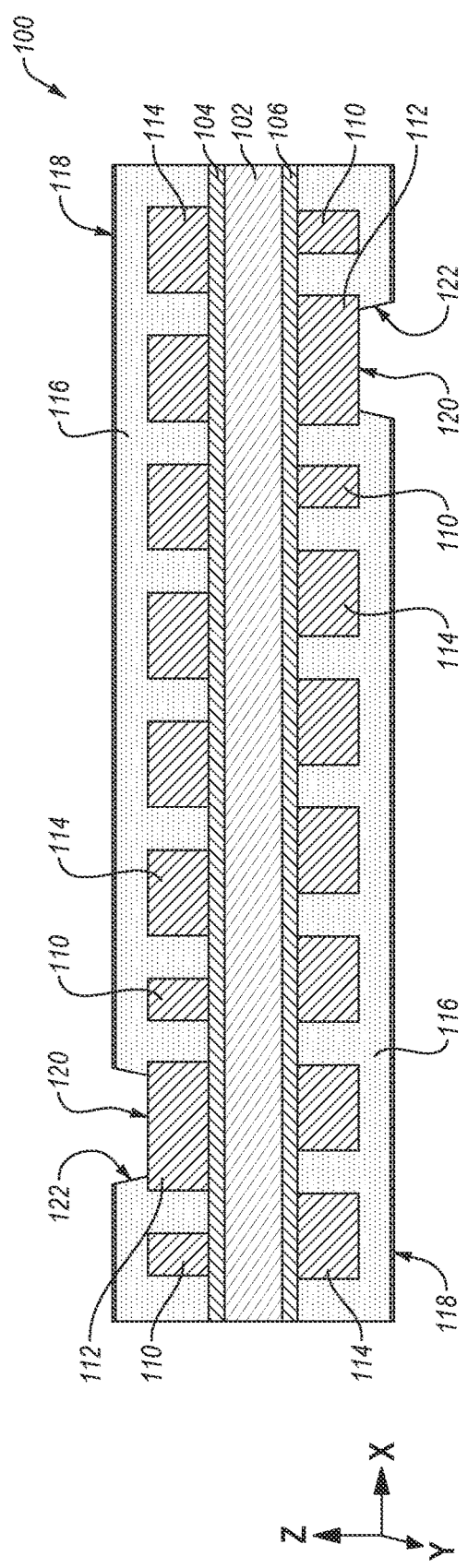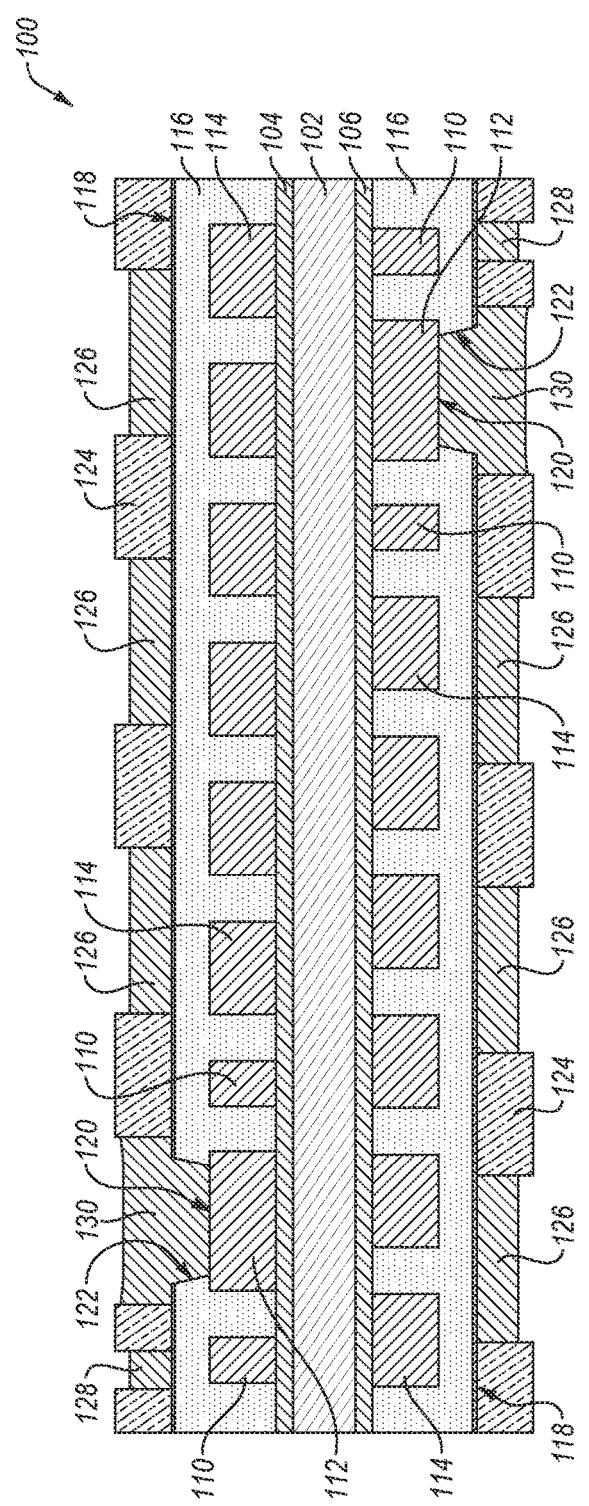

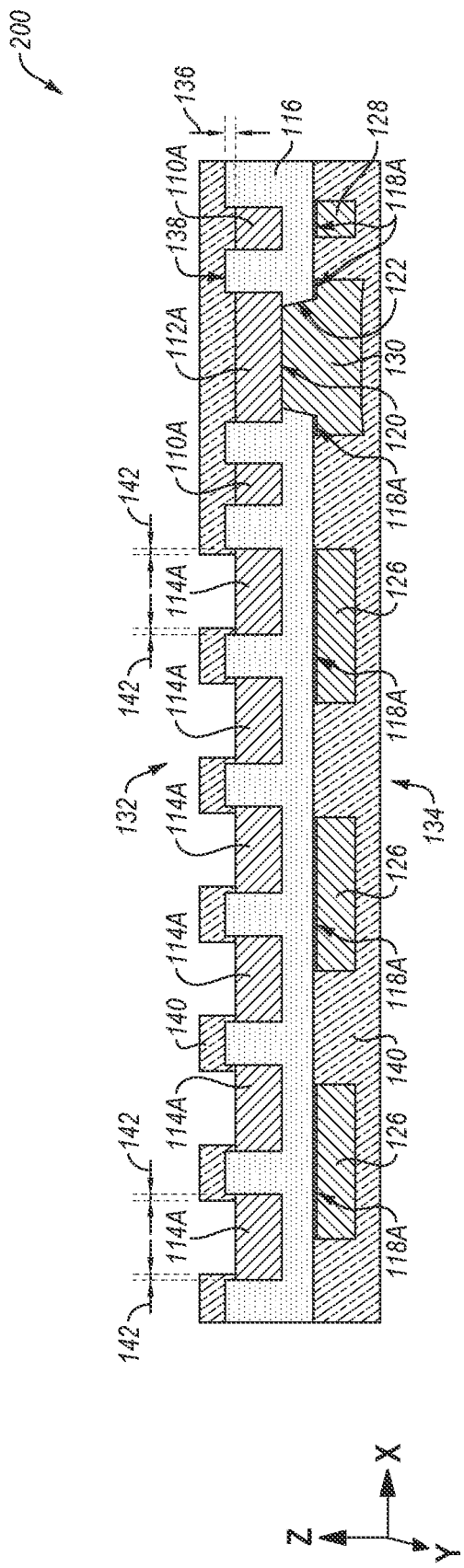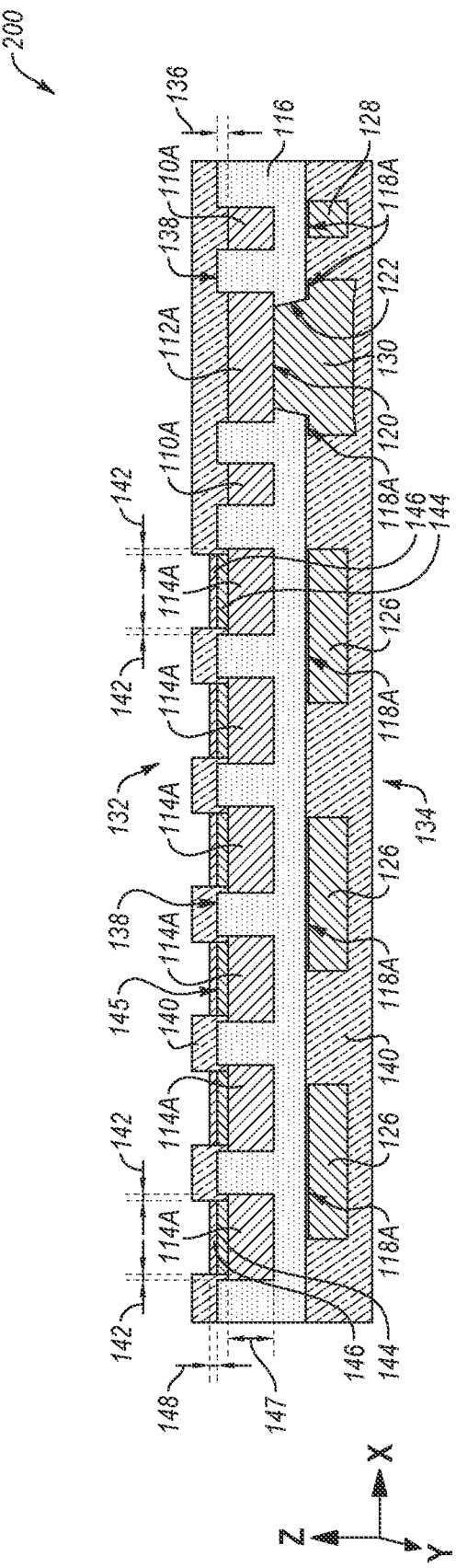
FIG. 2B
FIG. 2C

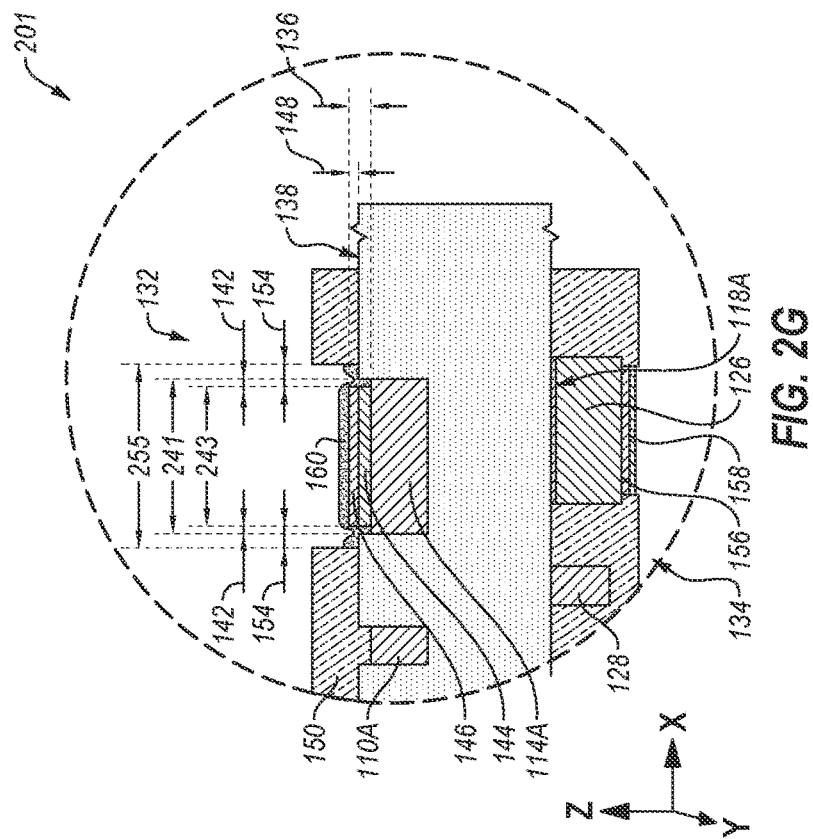
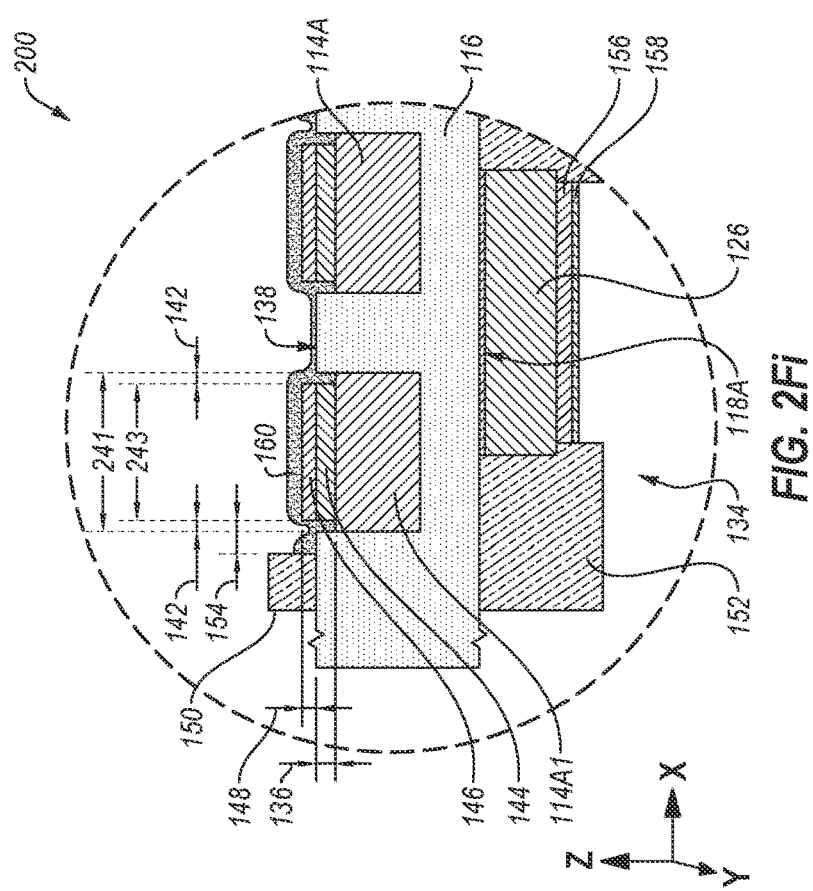

EMBEDDED TRACE SUBSTRATE ASSEMBLIES, AND RELATED MICROELECTRONIC DEVICE ASSEMBLIES, ELECTRONIC SYSTEMS, AND PROCESSES

TECHNICAL FIELD

The disclosure, in various embodiments, relates generally to the field of integrated circuit device substrates including embedded trace substrate design and fabrication. More specifically, the disclosure relates to bond finger structures in embedded trace substrates.

BACKGROUND

Integrated circuit devices may be mounted on package boards. Package boards may be used for mounting microelectronic devices and in turn for mounting the package boards on larger structures such as printed wiring boards. It is desired to improve package boards as a result of challenges of miniaturization both for fabricating integrated circuits on semiconductor wafers, and for coupling diced integrated circuits to the package boards.

BRIEF DESCRIPTION OF THE DRAWINGS

FIGS. 1A through 1G are simplified, longitudinal cross-section views of an embedded trace substrate assembly at different processing stages of a process of forming an integrated circuit device, in accordance with embodiments of the disclosure.

FIGS. 2A through 2F are simplified, longitudinal cross-section views of a released embedded trace substrate assembly taken from FIG. 1G at different processing stages of a process of forming an integrated circuit device, in accordance with embodiments of the disclosure.

FIG. 2Fi is a detailed enlargement taken from a section inset 2Fi in FIG. 2F.

FIG. 2G is a detailed enlargement of an embedded trace substrate assembly according to embodiments of the disclosure.

DETAILED DESCRIPTION

Figure 1A:
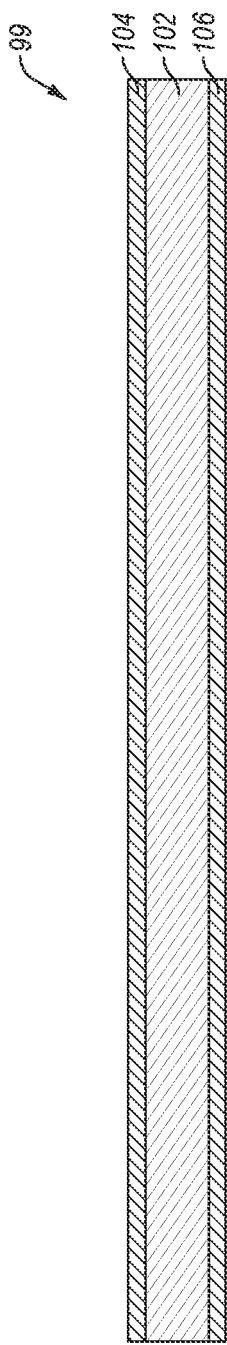

During miniaturization trends for substrate assemblies that are used for microelectronic devices, bond wire line spacing (L/S) issues of sufficient reduced spacing without bridging between adjacent bond wires are addressed. Also, with miniaturization of substrate assemblies, issues of unsatisfactory wire bond stitch values are addressed, where useful mechanical pull strength before wire bond failure are resolved, by disclosed recessed bond finger pads and bump height plating materials on the recessed bond fingers.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device package substrate fabrication techniques employed in the industry. In addition, the description provided below does not form a complete process flow for manufacturing a microelectronic device package substrates (e.g., a package substrate for a memory device, a package substrate for an integrated-circuit device, a package substrate for a disaggregated-die integrated circuit device). The structures described below do not form a complete microelectronic device package substrate. However, those process acts and structures are useful to understand the embodiments of the disclosure are described in detail below. Additional acts to form a complete microelectronic device package substrate from the structures may be performed by conventional fabrication techniques.

Drawings presented herein are for illustrative purposes only and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "package substrate" refers to a printed wiring board for mounting a microelectronic device such as a memory die or a processor die, and the package substrate is in turn mountable upon a larger printed wiring board such as a motherboard. A package substrate may be an embedded trace substrate assembly where principal portions of electrical connection structures may be below top organic surfaces of the package substrate. An embedded trace substrate assembly may be a base for assembling a disaggregated-die integrated circuit system.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random-access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "integrated circuit" or "integrated-circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation or a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated-die device" where distinct integrated-circuit components are associated to produce the higher function such as that of an SoC, including a processor alone, a memory alone, a processor and a memory, or an integrated-circuit device including logic and memory. A disaggregated-die device may be a system-in-package (SiP) assembly that includes at least two of at least one logic processor, at least one graphics processor, at least one memory device such as a 3-dimensional NAND memory device, at least one radio-frequency device, at least one analog device such as a capacitor, an inductor, a resistor, a balun, and these several at least one SiP devices, among others, may be assembled and connected with at least one embedded, multi-die interconnect bridge (EMIB) device, and at least two of the devices may be coupled with through-silicon via (TSV) technologies.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis. Further as used herein, a gate width direction may be presented as a "W" axis in a CMOS device, where the Y-axis is supplanted with the W-axis to indicate the direction of a gate width.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, "semiconductor substrate" means constructions comprising semiconductive material, including, but not limited to, bulk semiconductive materials such as a semiconductive wafer (either alone or in assemblies comprising other materials), and semiconductive material layers or characteristic structures (either alone or in assemblies comprising other materials). The term "substrate" refers to any supporting structure, including, but not limited to, the semiconductor substrates described above. In some applications the substrate may correspond to a semiconductor substrate containing one or more materials associated with integrated circuit fabrication. Such materials may include, for example, one or more of refractory metal materials, barrier materials, diffusion materials, insulator materials, etc.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1A through 1G are simplified, longitudinal cross-section views of an embedded trace substrate assembly at different processing stages of a process of forming an integrated circuit device, in accordance with embodiments of the disclosure. FIGS. 2A through 2F are simplified, longitudinal cross-section views of a released embedded trace substrate assembly taken from FIG. 1G at different processing stages of a process of forming an integrated circuit device, in accordance with embodiments of the disclosure. An embedded trace substrate (ETS) assembly may include traces that are integral with a printed wiring board (PWB) structure such as having principal portions of electrical connections that are at or below surfaces of the organic material of the printed wiring board. By "trace" it is meant in general for electrical contact structures, electrical intra-board connecting structures, leads for electrical wire-bond finger pad structures, and other conductive structures that may have portions exposed for electrical contact, or other structures that extend between other contact structures, under a solder-resist material. A "principal portion" of an electrical connection may mean a majority of the electrical connection is at or below the surfaces of the organic material of the printed wiring board. An ETS printed wiring board may be a package substrate that has a die side and a board side (e.g., die side 132 and board side 134 in FIG. 2A). The ETS printed wiring board may have electrical connections on a die side of the printed wiring board, for connecting to active integrated circuit devices such as microelectronic devices, including processor devices, memory devices, radio-frequency devices, motion-sensitive devices. An ETS printed wiring board may also include solder bump pads on the die side for mounting flip-chip microelectronic devices such as processors, radio-frequency devices, memory devices, and other microelectronic devices. The ETS printed wiring board may also have electrical connections on the die side for connecting to passive devices such as capacitors, inductors, resistors, baluns, radio-frequency identification devices and other devices to be coupled to the integrated circuit devices on the die side. The ETS printed wiring board on the die side, may include an electrical contact array such as bond fingers for wire bonding having principal portions of the bond fingers that are at or below surfaces of the organic material of the PWB structure. The ETS printed wiring board on the die side, may include via contacts for communication between the die side and the board side. The ETS printed wiring board on the die side may include "top traces" for electrical communication on the die side for intra-chip-side connections among chip-side devices. An ETS printed wiring board may be a package substrate that has electrical connections on a board side, opposite the die side, for coupling to a larger board such as a mother board printed wiring board, where the electrical connections on the board side may include electrical bump arrays such as solder bump arrays that include an array of electrical bump pads such as solder bump pads. The ETS printed wiring board on the board side may include "bottom traces" for electrical communication on the board side for intra-board-side connections among board-side structures. An ETS printed wiring board may also include solder bump pads on the board side for electrical communication. Hereinafter, electrical connections on the die side may be referred to as "top structures" or first side structures, and electrical connections on the board side may be referred to as "board side" or second side structures.

Referring to FIG. 1A, an embedded trace substrate assembly precursor 99 includes a carrier wafer 102, a first conductive temporary layer 104 and a second conductive temporary layer 106 that is opposite the first conductive temporary layer 104. The carrier wafer 102, the first conductive temporary layer 104 and the second conductive temporary layer 106 are useful for two-sided production embodiments for ETS printed wiring boards. In an embodiment, the first conductive temporary layer 104 and the second conductive temporary layer 106 are electronics-grade copper.

Figure 1B:
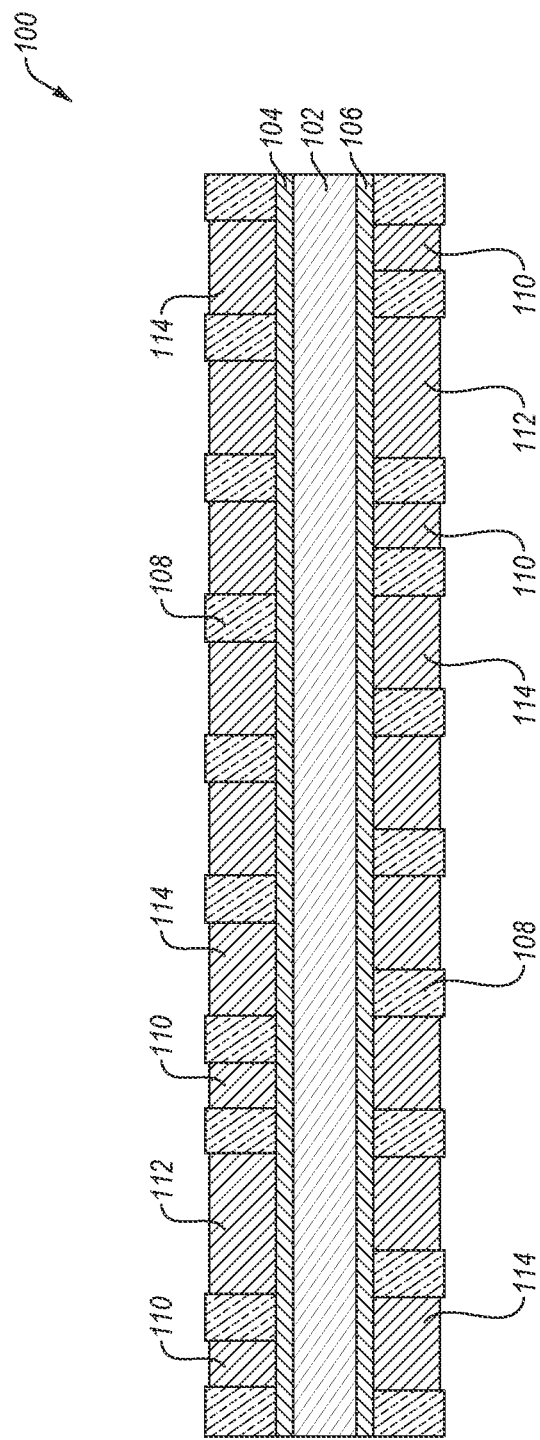

Referring to FIG. 1B, an embedded trace substrate assembly 100 constructed on the embedded trace substrate assembly precursor 99 (FIG. 1A), illustrates a processing stage where a first masking material 108 has been patterned on each of the first conductive temporary layer 104 and the second conductive temporary layer 106, and a plating process has been done to include the formation of electrically conductive structures such as traces 110 (also referred to as top traces 110A), via contacts 112, and bond-finger pads 114 for wire-bond interconnects. Plating materials for the traces 110, via contacts 112, and bond-finger pads 114 may include electronics grade copper (Cu). In an embodiment, plating is done by using the first conductive temporary layer 104 and the second conductive temporary layer 106 as cathodes, and electronics-grade copper is electroplated onto the embedded trace substrate assembly 100. Other electrically conductive materials may be used to form the traces 110, via contacts 112, and bond-finger pads 114, such as silver (Ag), copper-silver alloys, gold (Au), gold-silver alloys, copper-silver-gold alloys, aluminum (Al), and other electrically conductive materials.

Referring to FIG. 1C, the embedded trace substrate assembly 100 has been stripped of the first masking material 108 (FIG. 1B) to leave the traces 110, the via contacts 112, and the bond-finger pads 114 upon the first conductive temporary layer 104 and the second conductive temporary layer 106. In an embodiment, the first masking material 108 (FIG. 1B) is removed by a dry stripping process that substantially exposes both the first conductive temporary layer 104 and the second conductive temporary layer 106, as well as the traces 110, the via contacts 112, and the bond-finger pads 114.

Referring to FIG. 1D, the embedded trace substrate assembly 100 has been overlaid with a build-up lamination material 116, such as a prepreg material useful for printed wiring board structures for microelectronic device mounting. Processing may include spinning on a prepreg precursor material followed by curing and planarizing the build-up lamination material 116 if needed. The prepreg precursor material may be assembled in stages where a composite build-up lamination material 116 is useful. In an embodiment, a metallic seed material 118 is formed on the build-up lamination material 116, where the metallic seed material 118 may be a copper material useful for plating a second level of traces and pads on the embedded trace substrate assembly 100. In an embodiment, the metallic seed material 118 is an electronics-grade copper that is a substantially homogeneous copper composition, where the material of the traces 110, the via contacts 112, and the bond-finger pads 114 are electronics-grade copper. In an embodiment, the metallic seed material 118 is a non-metallic electrically conductive material such as a graphene seed material.

Referring to FIG. 1E, the embedded trace substrate assembly 100 has been processed to expose the via contact 112 at a via contact upper surface 120, by opening a via 122 through the build-up lamination material 116 and the metallic seed material 118. The via 122 may have non orthogonal sidewalls that expose the upper surface 120 of the via contact 112, where the non-orthogonal sidewalls have been formed characteristic of a laser-drilling process.

Referring to FIG. 1F, the embedded trace substrate assembly 100 has been processed with a second masking material 124 that has been patterned above the build-up lamination material 116 and the metallic seed material 118. The second masking material 124 may be a photoresist material that is spun onto and patterned above the build-up lamination material 116 and the metallic seed material 118. Following patterning of the second masking material 124, a second plating process is done to form bottom array bond pads 126, such as electrical bump array pads 126. The second plating process also forms bottom traces 128 and bottom via pads 130, where bottom array bond pads 126 and the bottom traces 128 are above surfaces of the build-up lamination material 116 and above and on the metallic seed material 118, and where the bottom via pads 130 contact the via contacts 112. The bottom via pads 130 also may be referred to as through-substrate filled vias 130, where the through-substrate filled vias 130 communicate from the board side 134 (e.g., FIG. 2A) to the die side 132 (e.g., FIG. 2A) by contacting the via contacts 112 on the die side 132. The "bottom" designation for FIG. 1F, refers to separated embedded trace substrate assemblies (e.g., the embedded trace substrate assembly 200, FIG. 2A) for useful reference to lower, bottom, or board-side connections.

Figure 1G:
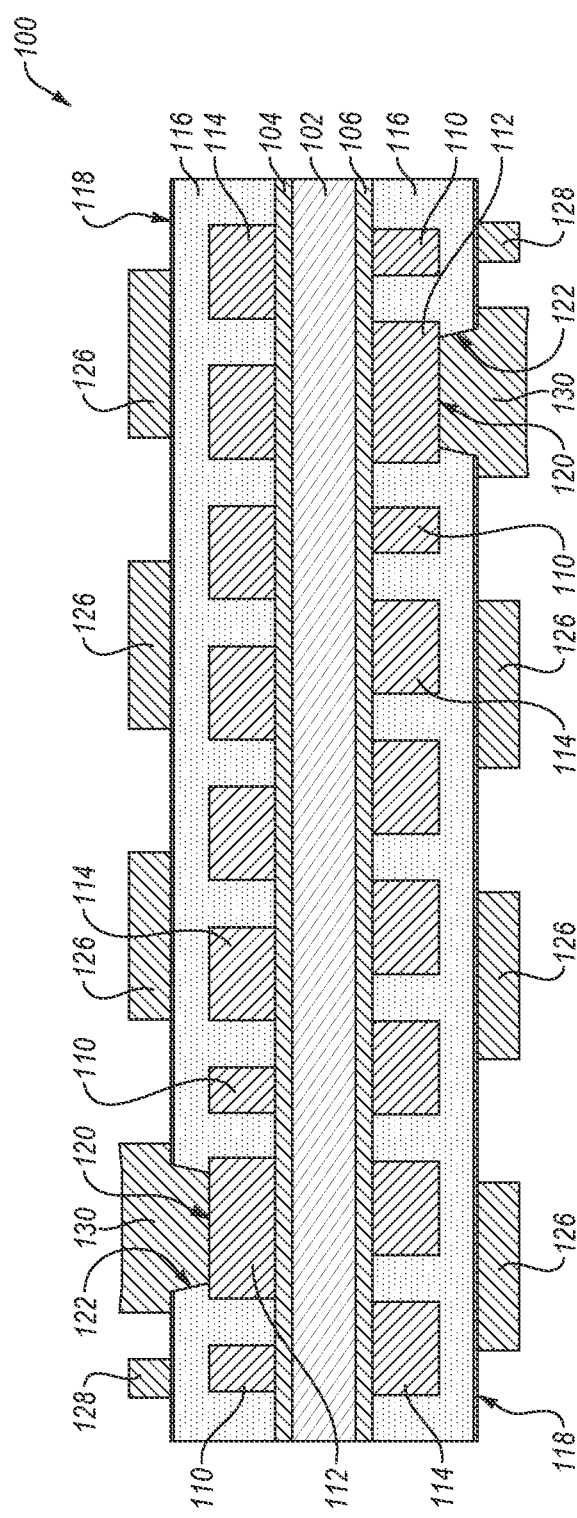

Referring to FIG. 1G, the embedded trace substrate assembly 100 has been stripped of the second masking material 124 (FIG. 1F) to leave the bottom array bond pads 126, bottom traces 128, and the bottom via pads 130. In an embodiment, an etching process is performed to singulate portions of the metallic seed material 118 (e.g., FIG. 2A) among the several bottom array bond pads 126, bottom traces 128, and the bottom via pads 130. Processing to singulate portions of the metallic seed material 118 among the several bottom array bond pads 126, bottom traces 128, and the bottom via pads 130 may be carried out in subsequent processing stages (e.g., FIG. 2A).

Figure 2A:
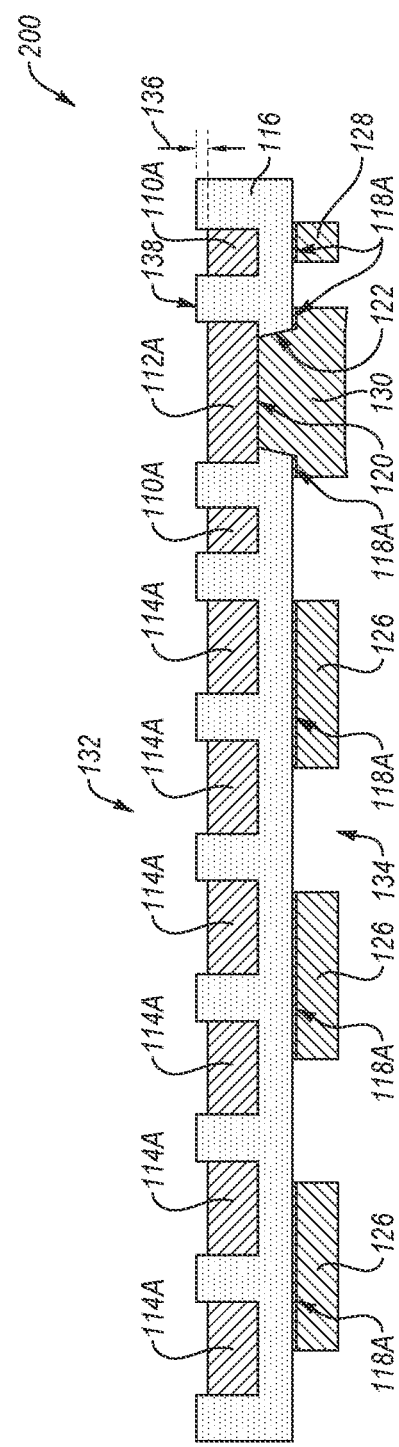

FIG. 2A is a simplified, longitudinal cross-section view of a portion of the embedded trace substrate assembly 100 depicted in FIG. 1G following subsequent processing to form embedded trace substrate assembly 200 (also referred to herein as a "released embedded trace substrate assembly 200"). The embedded trace substrate assembly 200 represents the structure that was built up onto the second conductive temporary layer 106 (FIGS. 1A through 1G), and the embedded trace substrate assembly 200 is depicted as having a die side 132 and a board side 134. Hereinafter, reference to the die side 132 may also be referred to as the first side 132, and reference to the board side 134 may also be referred to as the second side 134. Further, the die side 132 may be referred to as a top side 132 or an upper side 132, and the board side 134 may be referred to as a bottom side 134 or a lower side 134. Processing has been accomplished to remove the carrier wafer 102 (FIG. 1G) and the second conductive temporary layer 106 (FIG. 1G) such as by a thermal release process to separate the carrier wafer 102 (FIG. 1G) from the second conductive temporary layer 106 (FIG. 1G), followed by an etching process to remove the second conductive temporary layer 106 (FIG. 1G). In an embodiment, an etching process to remove the second conductive temporary layer 106 (FIG. 1G), results in recessing the several structures of the top traces 110, the top via contacts 112, and the bond-finger pads 114 (FIGS. 1A through 1G) as recessed top traces 110A, recessed top via contacts 112A, and recessed bond-finger pads 114A (hereinafter top traces 110A, top via contacts 112A, bond-finger pads 114A). Etching to form the top traces 110A, top via contacts 112A, and bond-finger pads 114A, may create a recess depth 136 that is a measurement between an upper surface 138 of the build-up lamination material 116 and the exposed level of the top traces 110A, top via contacts 112A, and bond-finger pads 114A. In an embodiment, the recess depth 136 is within a range from about 2 micrometers (μm) to about 6 μm.

Still referring to FIG. 2A, the metallic seed material 118 (FIGS. 1D through 1G) has been singulated to form metallic seed material 118A by processing such as a directional etch to remove exposed portions of the metallic seed material 118 (FIGS. 1D through 1G) between the several structures of the bottom array bond pads 126, the bottom traces 128, and the bottom via pads 130.

Referring to FIG. 2B, processing has been accomplished to form a third masking material 140 upon each of the die side 132 and the board side 134 of the embedded trace substrate assembly 200. Processing includes patterning the third masking material 140 on the die side 132 to expose the bond-finger pads 114A, and masking material encroachment distances 142 (also top plating material setback distance 142) of the third masking material 140 onto the bond-finger pads 114A, are measured by lateral boundaries of the bond-finger pads 114A and lateral boundaries of the third masking material 140 that exposes a portion but not all of the bond-finger pads 114A. In an embodiment, the third masking material 140 is formed by a dry film attach process using any useful known technique, followed by patterning and material removal to expose some of the bond-finger pads 114A that results in formation of the masking material encroachment distances 142. Other materials may be used to form the third masking material 140 such as a photoresist material that can be spun on, cured and patterned to form the masking material encroachment distances 142. In an embodiment, the masking material encroachment distances 142 are within a range from about 1 μm to about 4 μm.

Referring to FIG. 2C, processing has been accomplished to form a top first plating material 144 onto the several bond-finger pads 114A. In an embodiment, the top first plating material 144 is a nickel (Ni) containing material such as electronics grade nickel. The top first plating material 144 may fill onto the bond-finger pads 114A to a depth that is substantially the same as the recess depth 136, such that the recess depth 136 is substantially filled, and not over-topping upper surfaces 138 of the build-up lamination material 116, by the top first plating material 144, and such that the top first plating material 144 fills onto the bond-finger pads 114A to the level of the upper surface 138 of the build-up lamination material 116 on the die side 132. Put another way, the top first plating material 144 has a top surface 145 that is substantially coplanar with the upper surface 138 of the build-up lamination material 116 on the die side 132.

Still referring to FIG. 2C, processing has also been accomplished to form a top second plating material 146 onto the top first plating material 144. The top second plating material 146 may be an electronics grade gold (Au) material. The top second plating material 146 may be an electronics grade silver (Ag) material. The top second plating material 146 may be an electronics grade gold-silver alloy material. The top second plating material 146 is formed onto the top first plating material 144 such that the top second plating material 146 has a bump height 148 over the prepreg (BHP) portion of the build-up lamination material 116, where the bump height 148 extends above the upper surface 138 of the build-up lamination material 116, and the bump height 148 is within a range of from about 0.5 μm to about 1.3 μm. Consequently, the top second plating material 146 is higher than the bond finger pad 114A, resulting in an excellent wire bond stich pull value. Further, by extending the bump height 148 above the upper surface 138, a lower and less than useful wirebond stitch value is eliminated. In an embodiment, electroless plating is done without external electromotive attraction to form at least one of the top first plating material 144 and the top second plating material 146. Where the top second plating material 146 may have a bump height 148 that is measured above the upper surface 138, the embedded the bond-finger pads 114A have a vertical (Z-direction) thickness 147 within a range of from about 8 μm to about 16 μm. A ratio of the BHP height 148 to the bond-finger height 147 may have a comparative height ratio within a range of from about 0.03:1 to about 0.08:1. The bump height 148 is vertically above the upper surface 138 of the build-up lamination material 116.

Figure 2D:
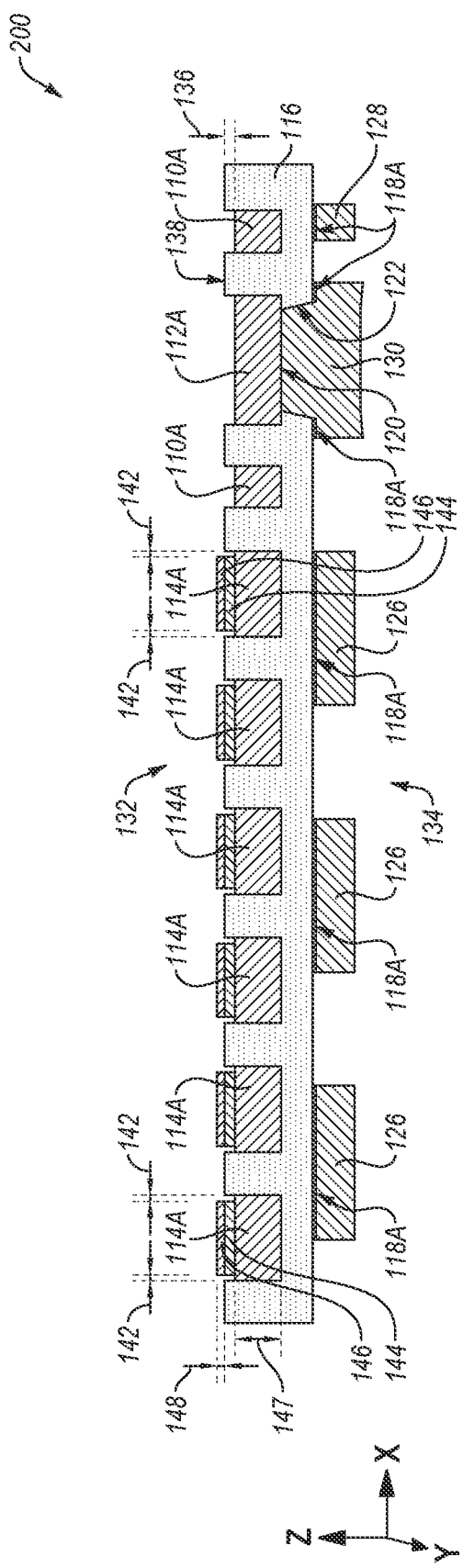

Referring to FIG. 2D, processing has been accomplished to remove the third masking material 140 (FIG. 2C) such that the approximate encroachment distances 142 that were accomplished by the third masking material 140 during deposition of the top first plating material 144 and the top second plating material 146 (FIG. 2C), may now be referred to as top plating material setback distances 142 where the top plating material setback distances 142 are similarly measured from lateral boundaries of the bond-finger pads 114A and lateral boundaries of at least the top second plating material 146. The top plating material setback distances 142 may be within a range of from about 1 μm to about 4 μm. The top second plating material 146 is laterally (X-direction) set back from a corner formed in the build-up lamination material 116 at the upper surface 138 by a distance within a range of from about 1 μm to about 4 μm.

Figure 2E:
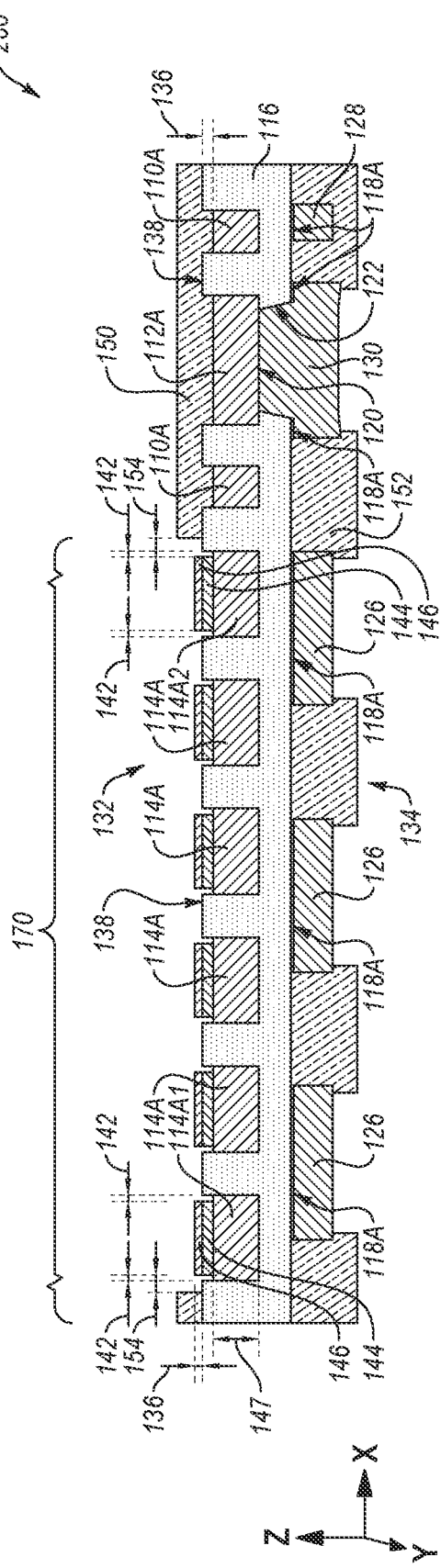

Referring to FIG. 2E, processing has been accomplished to form a top solder-resist material 150 and a patterned bottom solder-resist material 152. Processing may be done to use the same material for the top solder-resist material 150 and the bottom solder-resist material 152. The top solder-resist material 150 has been further processed by patterning to form solder-resist lateral setback distances 154 (illustrated for a first top bond-finger wire-bond pad 114A1 approximately at the left of FIG. 2E, and for a subsequent top bond-finger pad 114A2 approximately right of center of FIG. 2E), where the solder-resist lateral setback distances 154 may be greater than the top plating material setback distances 142. Where the top traces 110A may only be making intra-die-side connections, the top solder-resist material 150 may cover and protect the top traces 110A.

As shown in FIG. 2E, a wire-bond section 170 for several bond-finger pads 114A, has an open field where no top solder resist material 150 is within the wire-bond section 170. Put another way, the bond-finger pads 114A with the top first plating material 144 and top second plating material 146 within the bond-wire section 170, have solder resist material 150 structures that are proximate only peripherally adjacent the wire-bond section 170. Consequently, attaching bond wires 166 (e.g., FIG. 3) is performed without bridging of the bond wire material between adjacent bond-finger pads 114A at the top second plating material 146. In an embodiment, the solder-resist setback distances 154 are within a range of from about 4 μm to about 10 μm.

Still referring to FIG. 2E, a principal portion of the bond-finger pads 114A and the top first plating material 144 are substantially below the upper surface 138 of the organic material of the build-up lamination material 116. While the top second plating material 146 extends above the prepreg material of the build-up lamination material 116 as a whole, a principal portion of the bond-finger pads 114A, the top first plating material 144 and the top second plating material 146 is substantially below the upper surface 138 of the organic material of the build-up lamination material 116.

With continued reference to FIG. 2E, the bottom solder-resist material 152 is also formed to expose the bottom array bond pads 126 and the bottom via pads 130 for useful array coupling to a main printed wiring board (not illustrated), such as to a motherboard, where electrical bumps (not illustrated) couple the main printed wiring board (not illustrated) to the embedded trace substrate assembly 200 at the bottom array bond pads 126 and the bottom via pads 130. The lateral (X-direction) pitch between two adjacent bottom array bond pads 126 may be within a range of from about 300 μm to about 400 μm. Where the bottom traces 128 may only be making intra-board-side connections, the bottom solder-resist material 152 may cover and protect the bottom traces 128.

Figure 2F:
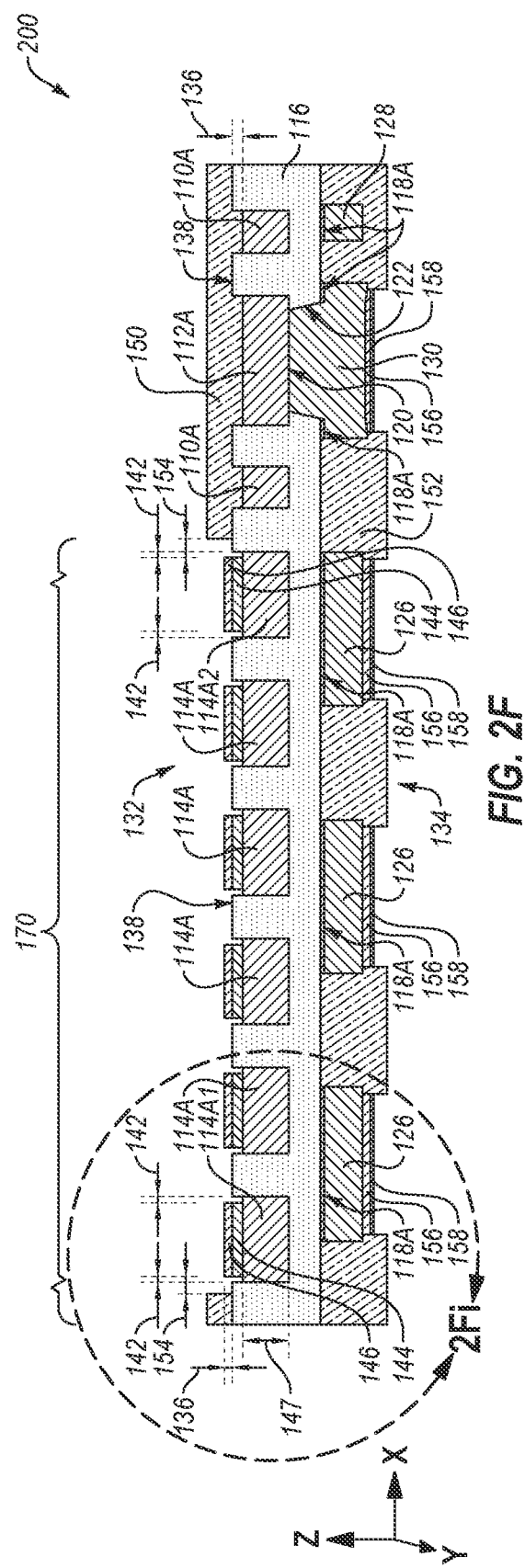

Referring to FIG. 2F, the embedded trace substrate assembly 200 has been further processed to form a bottom first plating material 156 onto the several bottom array bond pads 126 as well as on bottom via pads 130 (one occurrence illustrated). In an embodiment, the bottom first plating material 156 is a nickel (Ni) containing material such as electronics-grade nickel. The bottom first plating material 156 may fill onto the bottom array bond pads 126 and onto the bottom via pads 130 to vertically (Z-direction) fill at least some of the area laterally between adjacent portions of the bottom solder-resist material 152.

Still referring to FIG. 2F, processing has also been accomplished to form a bottom second plating material 158 onto the bottom first plating material 156. The bottom second plating material 158 may be an electronics grade gold (Au) material. The bottom second plating material 158 may be an electronics grade silver (Ag) material. The bottom second plating material 158 may be an electronics grade gold-silver alloy material. The bottom second plating material 158 is formed onto the bottom first plating material 156 such that the bottom second plating material 158 may be at or below (positive Z-direction) vertical limits of the bottom solder-resist material 152 at the board side 134. With processing accomplished as illustrated in FIG. 2F, the embedded trace substrate assembly 200 may be referred to as an embedded trace microelectronic device package substrate assembly 200.

FIG. 2Fi is an inset enlargement of a section 2Fi taken from FIG. 2F. After processing illustrated in FIG. 2F, an organic surface protectant (OSP) material 160 is formed over laterally exposed portions of the bond-finger pads 114A, as well as over lateral exposures of the top first plating material 144 and over the top second plating material 146. The OSP material 160 may be a flux-type protecting material that protects exposed metallic materials at least until, e.g., wire bonding onto the top second plating material 146. Use of the OSP material 160 facilitates protective maintenance of each of the top plating material setback distances 142 and the solder-resist lateral setback distances 154 that may otherwise expose electrically conductive materials during processing.

The bond-finger pads 114A may have a first width 241 that is defined in part as being set back from (X-direction) and recessed below (Z-direction) the exposed upper surface 138 of the build-up lamination material 116. The top second metallic material 146 has a second width 243 that is defined in part by a difference of the first width 241 and subtracting twice the top plating material setback distance 142. The second width 243 is less than the first width 241, and the second width 243 may be measured substantially centered within the first width 241 within processing parameters of forming the top second plating material 246, within processing registration parameters.

FIG. 2G is an inset enlargement of an embedded trace substrate assembly 201, such as the embedded trace substrate assembly 200 depicted in FIG. 2F, where a bond-finger pad 114A may be exposed by adjacent occurrences of the top solder-resist material 150. Unlike an open wire-bond section 170 illustrated in FIG. 2F (also FIG. 3), occurrences on both sides (X-direction illustrated, and also Y-direction) of bond-finger pads 114A may be located at the die side 132, with the top solder-resist material 150 adjacent on either side when viewed in, e.g., X-Z cross section. The illustrated bond-finger pad 114A of the embedded trace substrate assembly 201, may have the first width 241 that is defined in part as being set back from (X-direction) and recessed below (Z-direction) the exposed upper surface 138 of the build-up lamination material 116. The top second metallic material 146 has a second width 243 that is defined in part by a difference of the first width 241 and subtracting twice the top plating material lateral setback distance 142. The second width 243 is less than the first width 241. A third width 255 is defined in part by a sum of the second width 243 and adding twice the solder-resist setback distance 154 that is created by the top solder-resist material 150 adjacent and set back from each of the bond-finger pad 114A, the top first plating material 144 and the top second plating material 146. The third width 255 is greater than the second width 243 and the second width 243 may be measured substantially centered within the third width 255 within processing registration parameters of forming the solder-resist lateral setback distance 154 about the top second plating material 246.

Figure 3:
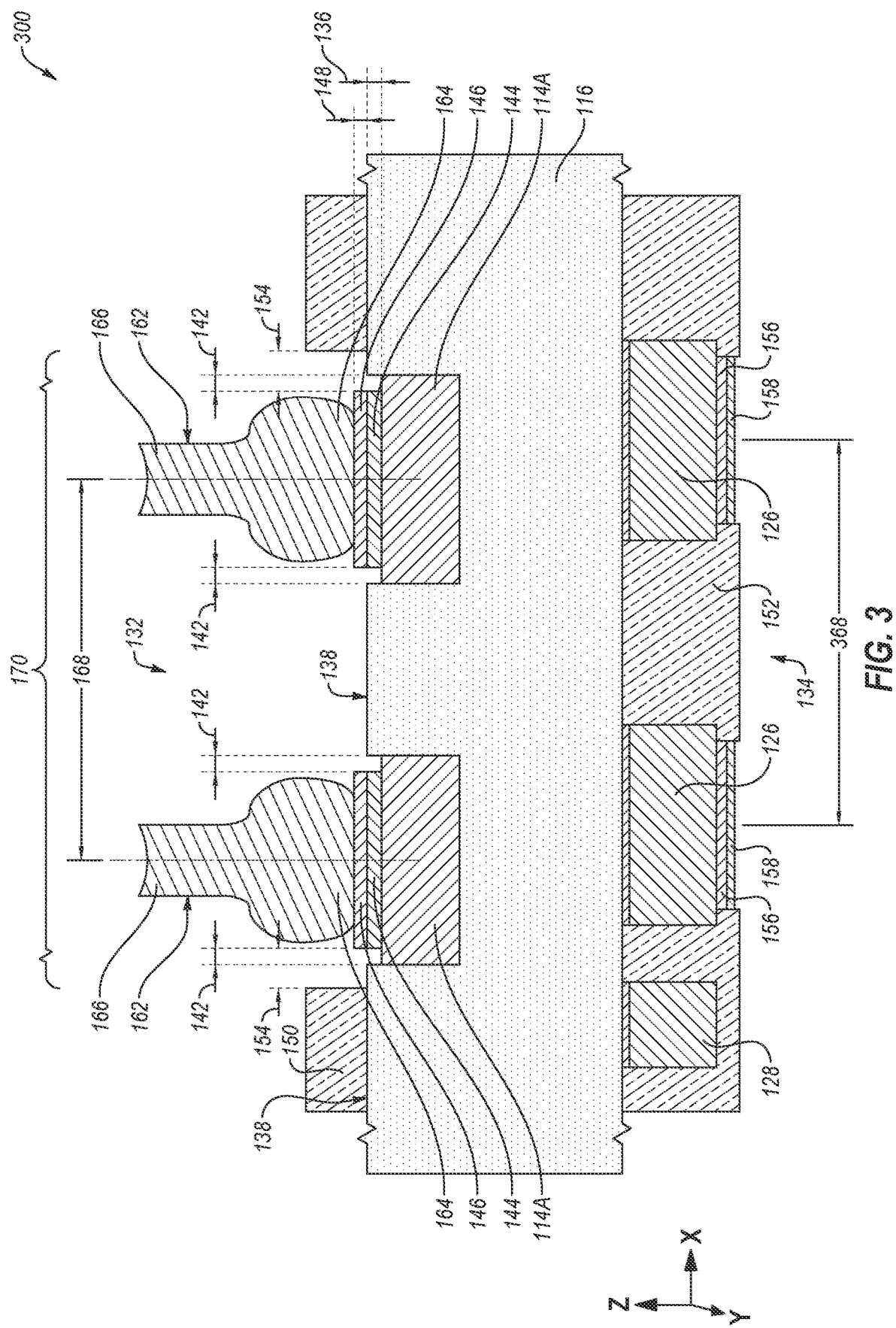
FIG. 3 is a simplified, longitudinal cross-section embedded trace substrate assembly, in accordance with embodiments of the disclosure.

FIG. 3 is a simplified, longitudinal cross-section view of an embedded trace substrate assembly 300 that may be taken and expanded from the embedded trace substrate assembly 200 depicted in FIG. 2F after wire bonding has been accomplished according to several embodiments. The embedded trace substrate assembly 300 may be referred to as a microelectronic device package substrate assembly 300. Bond wires 162 have been attached above the bond-finger pads 114A, where the bond wires 162 include a bond-finger-attach portion 164 that physically and metallurgically contacts the top second plating material 146. The bond wires may be a metallic material such as a lead-based tin solder material. The bond wires may be a metallic material such as a silver-based tin solder material. The bond wires may be a metallic material such as Au wire, Ag wire, Au Ag combination, Cu, Cu Pd and any alloy or material combination for wire bonding material. The bond wires 162 also have elongate wire portions 166 that emerge from the bond-finger-attach portion 164. In an embodiment, the metallurgical bond between the top second plating material 146 and the bond-finger-attach portion 164, allows for a useful wire bond stitch value such as a minimum of about 1.8 gram force (gf), which is a mechanical pull strength (also referred to as a wire bond stitch value), before wire bond failure where the bond wire 162 otherwise pulls away from the top second plating material 146. The bond-finger-attach portions 164 of the bond wires 162, may have a lateral width (X-direction) that is less than or equal to the lateral width (X-direction) of the top second plating material 146. Further in an embodiment, the bond-finger-attach portion 164 of the bond wire 162, may have a lateral width (X-direction) that does not extend to touch any portion of the build-up lamination material 116 including the exposed upper surface 138 of the build-up lamination material 116. Consequently, a line spacing (L/S) distance 168 that is measured between centers of adjacent top wire bond finger pads 114A, is maintained to resist wire-bond shorting that may otherwise occur by metallurgical bridging between two adjacent bond wires 162. The L/S distance 168 may be within a range of from about 10 µm to about 60 µm. In some embodiments, the L/S distance 168 may be within a range from about 10 µm to about 60 µm. In some embodiments, the L/S distance 168 may be within a range from about 10 µm to about 50 µm. In some embodiments, the L/S distance 168 may be within a range from about 10 µm to about 40 µm. In some embodiments, the L/S distance 168 may be within a range from about 10 µm to about 30 µm. In some embodiments, the L/S distance 168 may be within a range from about 10 µm to about 20 µm. In some embodiments, the L/S distance is within a range of from about 30 µm to about 50 µm. The bond-finger-attach portions 164 of the bond wires 162 have a lateral (X-direction) width that is at least 80 percent less than the line spacing 168 between adjacent bond wires 162. Line spacing 368 between adjacent bottom array bond pads 126, including the bottom via pads 130, may be within a range of from about 400 µm to about 800 µm.

Still referring to FIG. 3, wire bond metallurgy between the bond wire 162 and the top second plating material 146, may facilitate a balance between sufficient wetting during wire bonding, to achieve a useful wire bond stitch value, and a useful lateral restriction extent of the bond-finger-attach portion 164 of the bond wire 162 so as not to have the bond-finger-attach portion 164 of the bond wire 162 contact any of the build-up lamination material 116, nor to bridge to an adjacent bond wire 162. The bond wire 162 may be attached to an electronic device such as wire-bonded memory device, by extending the bond wire 162, between the embedded trace substrate assembly 300 to the microelectronic device such as a wire-bonded DRAM device (e.g., wire-bonded microelectronic memory device 476 FIG. 4) that is seated on a portion of the top solder resist material 150 above the build-up lamination material 116, and the DRAM device (e.g., wire-bond microelectronic memory device 476 FIG. 4) is wire bonded using the bond wires 162, as the bond wires 162 are electrically and metallurgically bonded to the top second plating material 146, without any of the bond-finger-attach portion 164 contacting either of the exposed upper surface 138, the top solder resist material 150, or an adjacent bond wire 162.

Figure 4:
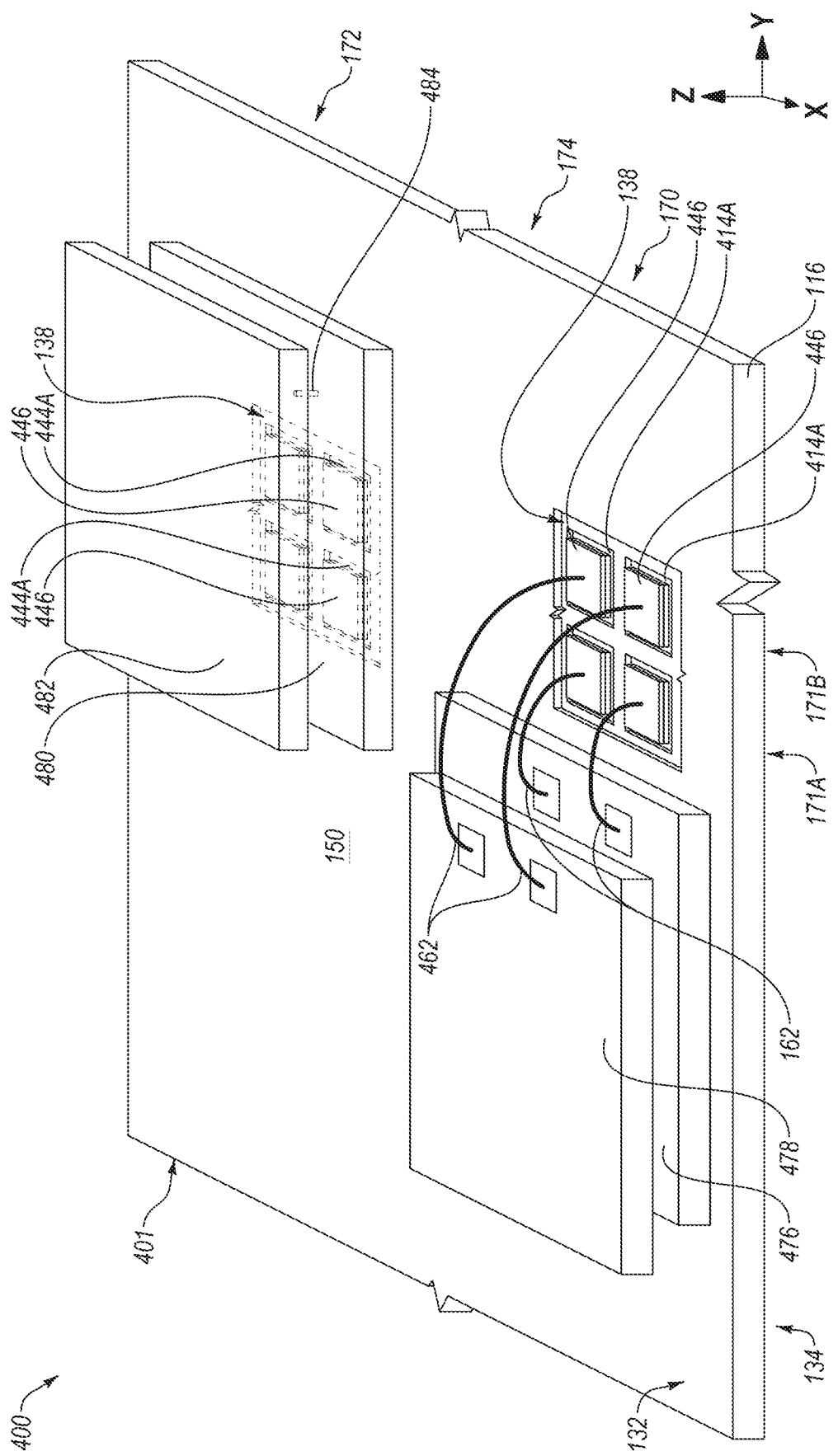
FIG. 4 is a simplified perspective view of a microelectronic device package that includes an embedded trace substrate assembly, in accordance with embodiments of the disclosure.

FIG. 4 is a simplified, perspective view of a microelectronic device assembly 400 coupled to an embedded trace substrate assembly 401, according to several embodiments. Several microelectronic devices, including a first wire-bonded microelectronic memory device 476 and a subsequent wire-bonded microelectronic memory device 478, are wire bonded to several occurrences of bond-finger pads 114A and 414A. The first bond-finger pads 114A may be arranged in a first bond-finger pad row 171A, and the subsequent bond-finger pads 414A may be arranged in a subsequent bond-finger pad row 171B. The enumerated bond-finger pads 114A may be similarly situated as are the bond-finger pads 114A illustrated in FIG. 3. In an embodiment, some bond-finger pads 414A may be found relative to FIG. 3, extending in the Y-direction in rows that are orthogonal to the plane of the drawing in FIG. 3. Substantially identical structures of a first top second plating material 146, and a subsequent top second plating material 446 are coupled above respective first bond-finger pads 114A and subsequent bond finger pads 414A. First bond wires 162 electrically couple the first wire-bonded microelectronic device 476 to the first top second plating material 146, and subsequent bond wires 462 electrically couple the subsequent wire-bonded microelectronic memory device 478 to the subsequent top second plating material 446. The respective first wire-bonded microelectronic memory device 476 and subsequent wire-bonded microelectronic memory device 478 may be DRAM memory devices: a wire-bond first microelectronic memory device 476 and a wire-bond subsequent microelectronic memory device 478. More wire-bonded microelectronic devices may be stacked, than the illustrated respective first wire-bonded microelectronic memory device 476 and subsequent wire-bonded microelectronic memory device 478. In an embodiment, four (4) wire-bonded microelectronic devices are stacked, including the first wire-bonded microelectronic memory device 476 upon the solder resist material 150, and two (2) wire-bonded microelectronic devices between the first wire-bonded microelectronic memory device 476 and the subsequent wire-bonded microelectronic memory device 478. Each of the four (4) stacked wire-bonded microelectronic devices may be coupled to a respective first-through fourth row of bond-finger pads, e.g., bond-finger pads 114A. In an embodiment, eight (8) stacked wire-bonded microelectronic devices are stacked, including the first wire-bonded microelectronic memory device 476 upon the solder resist material 150, and six (6) wire-bonded microelectronic memory devices between the first wire-bonded microelectronic memory device 476 and the subsequent wire-bonded microelectronic memory device 478. Each of the eight (8) stacked wire-bonded microelectronic devices may be coupled to a respective first-through fourth row of bond-finger pads, e.g., bond-finger pads 114A.

Still referring to FIG. 4, within an electrical bump array section 172 of the microelectronic device assembly 400, a stack of flip-chip microelectronic devices 480 and 482 are assembled above the solder resist material 150. In an embodiment, a single flip-chip microelectronic device 480 occupies the footprint of the electrical bump array section 172. The stack of flip-chip devices may include a first flip-chip microelectronic device 480, and a subsequent flip-chip microelectronic device 482. Electrical bump array bond pads 444A, that may be structurally similar to the bond-finger pads 114A, may be substantially linearly aligned with the first bond-finger pad row 171A and the subsequent bond-finger pad row 171B. The electrical bump array bond pads 444A are illustrated with dashed lines as they are within the build-up lamination material 116 and are obscured by at least the first flip-chip microelectronic device 480. The electrical bump array bond pads 444A may also be exposed at the exposed upper surface 138 within the electrical bump array section 172, similarly as are the first and subsequent bond finger pads 114A and 414A within the wire-bond section 170. In an embodiment, the electrical bump array bond pads 444A are not separated by occurrences of the solder resist material 158 (e.g., FIG. 2Fi). In an embodiment, the electrical bump array bond pads 414A are separated by occurrences of the solder resist material 158 (e.g., FIG. 2G). Still referring to FIG. 4, at least two flip-chip microelectronic devices 480 and 482 are stacked one above the other above the solder resist material 150, and the first flip-chip microelectronic device 480 is coupled to the electrical bump bond pads 444A through the exposed upper surface 138 in the electrical bump array section 172 of the embedded trace substrate assembly 401. The illustrated electrical bump array bond pads 444A are coupled to the first flip-chip microelectronic device 480 with electrical bumps (e.g., electrical bumps 174, FIG. 5), and the subsequent flip-chip microelectronic device 482 is coupled to the first flip-chip microelectronic device 480 by at least one through-silicon via (TSV) 484 that is within the first flip-chip microelectronic device 480. In an embodiment, four (4) flip-chip microelectronic devices are stacked, including the first flip-chip microelectronic device 480 above the electrical bump array bond pads 444A, and two (2) flip-chip microelectronic devices between the first flip-chip microelectronic device 480 and the subsequent flip-chip microelectronic device 482. In an embodiment, eight (8) stacked flip-chip microelectronic devices are stacked, including the first flip-chip microelectronic device 480 above the electrical bump array bond pads 444A, and six (6 flip-chip microelectronic devices between the first flip-chip microelectronic device 480 and the subsequent flip-chip microelectronic device 482.

Figure 5:
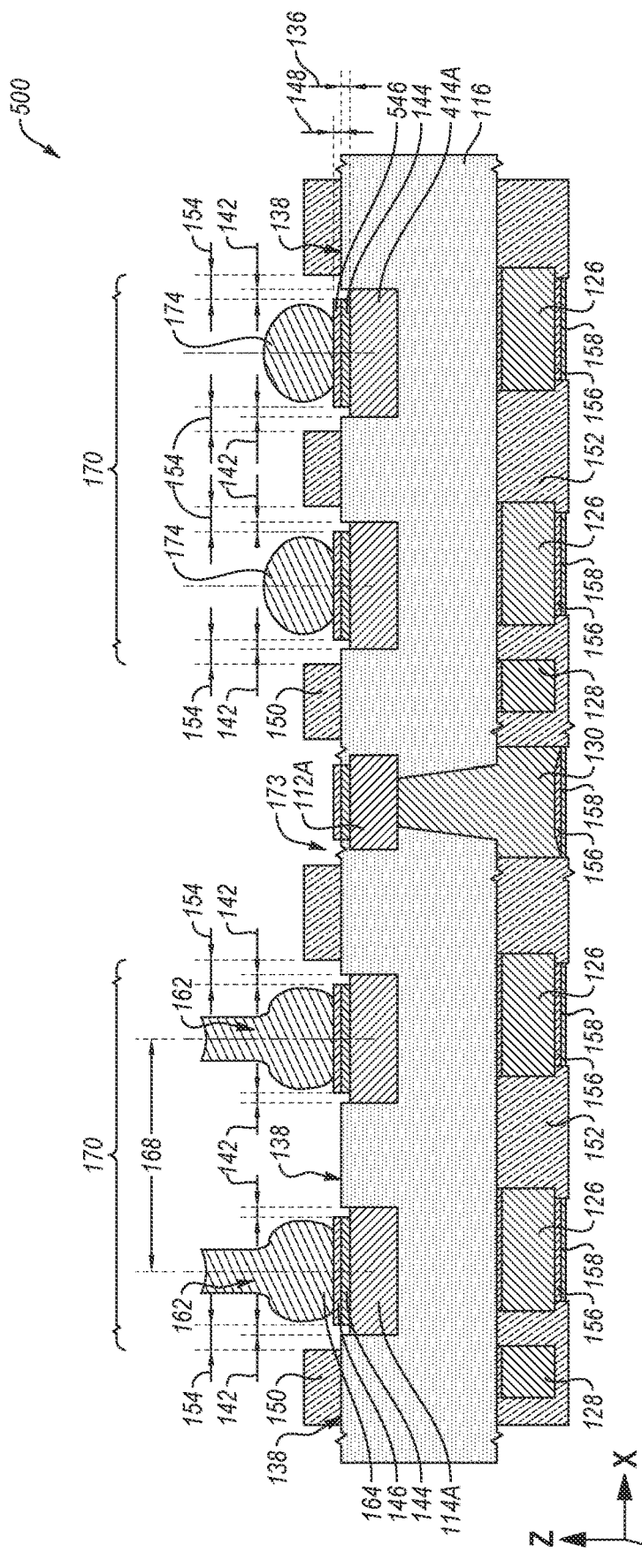
FIG. 5 is a simplified, longitudinal cross-section view of an embedded trace substrate assembly including a wire-bond section and flip-chip section, in accordance with embodiments of the disclosure.

FIG. 5 is a simplified, longitudinal cross-section view of a portion of an embedded trace substrate assembly 500, in accordance with embodiments of the disclosure. The embedded trace substrate assembly 500 may have a wire bond section 170 such as for a wire bond microelectronic device (e.g., FIG. 4), and an electrical bump array section 172 for a flip-chip assembled microelectronic device (e.g., FIG. 4). The embedded trace substrate assembly 500 may be referred to as a microelectronic device package embedded trace substrate (ETS) assembly 500. The electrical bump array section 172 of the embedded trace substrate assembly 500 may be for mounting microelectronic devices, such as for a processor device (e.g., the first flip-chip microelectronic device 480, FIG. 4), such as a central processing unit, a graphics processing unit, a radio frequency transceiver device, or other useful devices that may be electrically and metallurgically bonded to top second plating materials 446 within the electrical bump array section 172. In an embodiment, the wire bond section 170 and the electrical bump array section 172 are not adjacent one another, as illustrated by a discontinuity 173. Similarly to the bond wires 162 illustrated in FIGS. 3 and 4, bond wires 162 have been attached above the bond-finger pads 114A within the wire bond section 170, where the bond wires 162 include a bond-finger-attach portion 164 that physically and metallurgically contacts the top second plating material 146. The bond wires 162 also have an elongate wire portion 166 that emerges from the bond-finger-attach portion 164. In an embodiment, the metallurgical bond between the top second plating material 146 and the bond-finger-attach portion 164, allows for a useful wire bond stitch value, which is a mechanical pull strength, before wire bond failure where the bond wire 162 pulls off the top second plating material 146. Similarly to the bond wires 162, the electrical bumps 174 are physically and metallurgically bonded to a top second plating material 546 that may be formed simultaneously as the top second plating material 146. In an embodiment, the electrical bumps 174 are first bonded to an electrical bump array on a flip-chip device (e.g., the first flip-chip microelectronic device 480, FIG. 4), followed by the electrical bumps 174 are thermal compression bonded (TCB) to the top second plating material 546 within the electrical bump array section 172. The electrical bumps 174 may also achieve a physical and metallurgical bond that is confined to the top second plating material 546 with useful line spacing and without any of the electrical bumps 174 contacting the top solder resist material 150. In an embodiment, no occurrence of the solder resist material 150 is within the inter lateral boundaries of the electrical bump array section 172, similarly to no occurrence of the solder resist material 150 is within the inter lateral boundaries of the wire bond section 170. In an embodiment, a first flip-chip microelectronic device (e.g., the first flip-chip microelectronic device 480, FIG. 4) is mounted within the electrical bump array section 172 at the electrical bumps 174, and a subsequent flip-chip microelectronic device (e.g., the subsequent flip-chip microelectronic device 482, FIG. 4) is mounted above the first flip-chip device, and electrical and signal communication between the first microelectronic device 480 and the subsequent microelectronic device 482 is with a through-silicon via (TSV, e.g., the TSV 484, FIG. 4).

Figure 6:
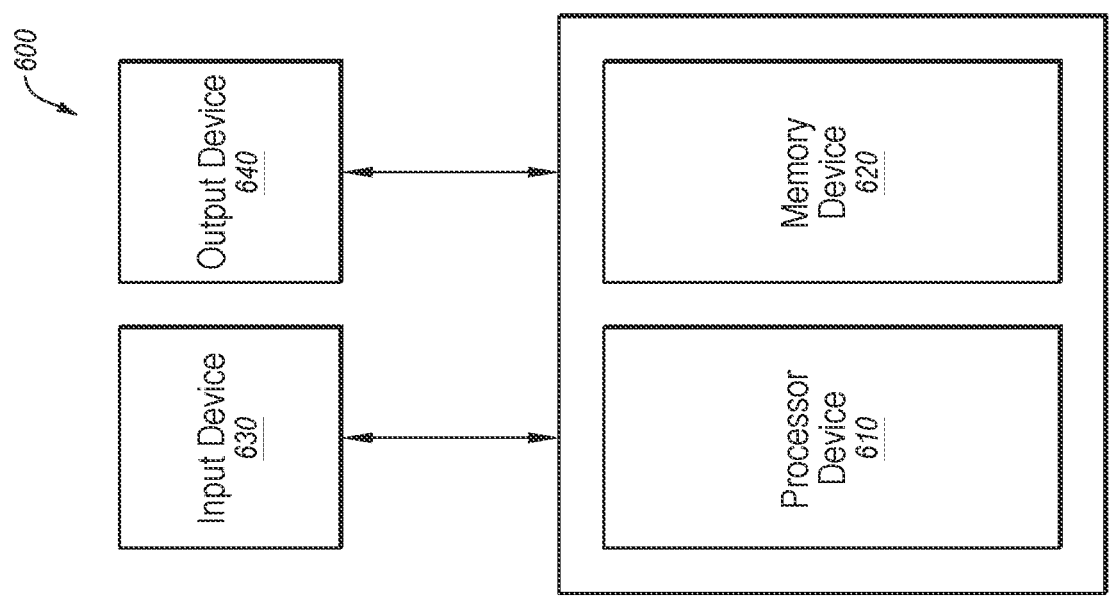
FIG. 6 is a block diagram of an electronic system, according to embodiments of disclosure.

Embedded trace substrate assemblies of the disclosure, such as the embedded trace substrate assemblies 200 (FIG. 2F), 201 (FIG. 2G), 300 (FIG. 3), 401 (FIG. 4), and 500 (FIG. 5) of the disclosure may be included in embodiments of electronic systems of the disclosure. For example, FIG. 6 is a block diagram of an electronic system 600, according to embodiments of disclosure. Such an electronic system 600 may include, for example, the microelectronic device assembly 400 illustrated in FIG. 4, which may be included as described and illustrated, in whole or in part, an electronic system 600. The electronic system 600 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, or a navigation device, etc., where embodiments of embedded trace substrate assemblies 200 (FIG. 2F), 201 (FIG. 2G), 300 (FIG. 3), 401 (FIG. 4), and 500 (FIG. 5) may be employed. The electronic system 600 includes at least one memory device 620. The memory device 620 may include, for example, one or more microelectronic devices that are wire bonded to embodiments of embedded trace substrate assemblies 200 (FIG. 2F), 201 (FIG. 2G), 300 (FIG. 3), 401 (FIG. 4), and 500 (FIG. 5), of the disclosure. The electronic system 600 may further include at least one electronic signal processor device 610 (often referred to as a "microprocessor") that is part of an integrated circuit. The electronic signal processor device 610 may include, for example, one or more of more microelectronic devices that are either wire bonded or flip-chip bonded to embodiments of embedded trace substrate assemblies 200 (FIG. 2F), 201 (FIG. 2G), 300 (FIG. 3), 401 (FIG. 4), and 500 (FIG. 5) of the disclosure. While the memory device 620 and the electronic signal processor device 610 are depicted as two (2) separate devices in FIG. 6, in additional embodiments, a single (e.g., only one) memory/processor device having the functionalities of the memory device 620 and the electronic signal processor device 610 is included in the electronic system 600. In such embodiments, the memory/processor device may include, for example, one or more of more microelectronic devices that are either wire bonded or flip-chip bonded to embodiments of embedded trace substrate assemblies 200 (FIG. 2F), 201 (FIG. 2G), 300 (FIG. 3), 401 (FIG. 4), and 500 (FIG. 5) of the disclosure. The processor device 610 and the memory device 620 may be part of a central processing unit where the memory device 620 includes a wire bonded memory device that includes on-die DRAM cache memory. The processor device 610 and the memory device 620 may be part of a disaggregated-die, assembly 610 and 620 that may also be referred to as a disaggregated-die integrated circuit, including at least one of the processor device 610 and the memory device 620 includes more than one of such device in a more-than-two device disaggregated-die integrated circuit assembly where one or more of more microelectronic devices are either wire bonded or flip-chip bonded to embodiments of embedded trace substrate assemblies 200 (FIG. 2F), 201 (FIG. 2G), 300 (FIG. 3), 401 (FIG. 4), and 500 (FIG. 5) of the disclosure. Further, the disaggregated-die assembly 610 and 620 may be assembled with a bridge material such as in an embedded multi-interconnect bridge (EMIB) that may include at least one TSV interconnect in one of the dice being coupled to the EMIB.

The electronic system 600 may further include one or more input devices 630 for inputting information into the electronic system 600 by a user, such as, for example, a mouse or other pointing device, a keyboard, a touchpad, a button, or a control panel. The electronic system 600 may further include one or more output devices 640 for outputting information (e.g., visual or audio output) to a user such as, for example, a monitor, a display, a printer, an audio output jack, and/or a speaker. In some embodiments, the input device 630 and the output device 640 may comprise a single touchscreen device that can be used both to input information to the electronic system 600 and to output visual information to a user. The input device 630 and the output device 640 may communicate electrically with one or more of the memory device 620 and the electronic signal processor device 610.

Figure 7:
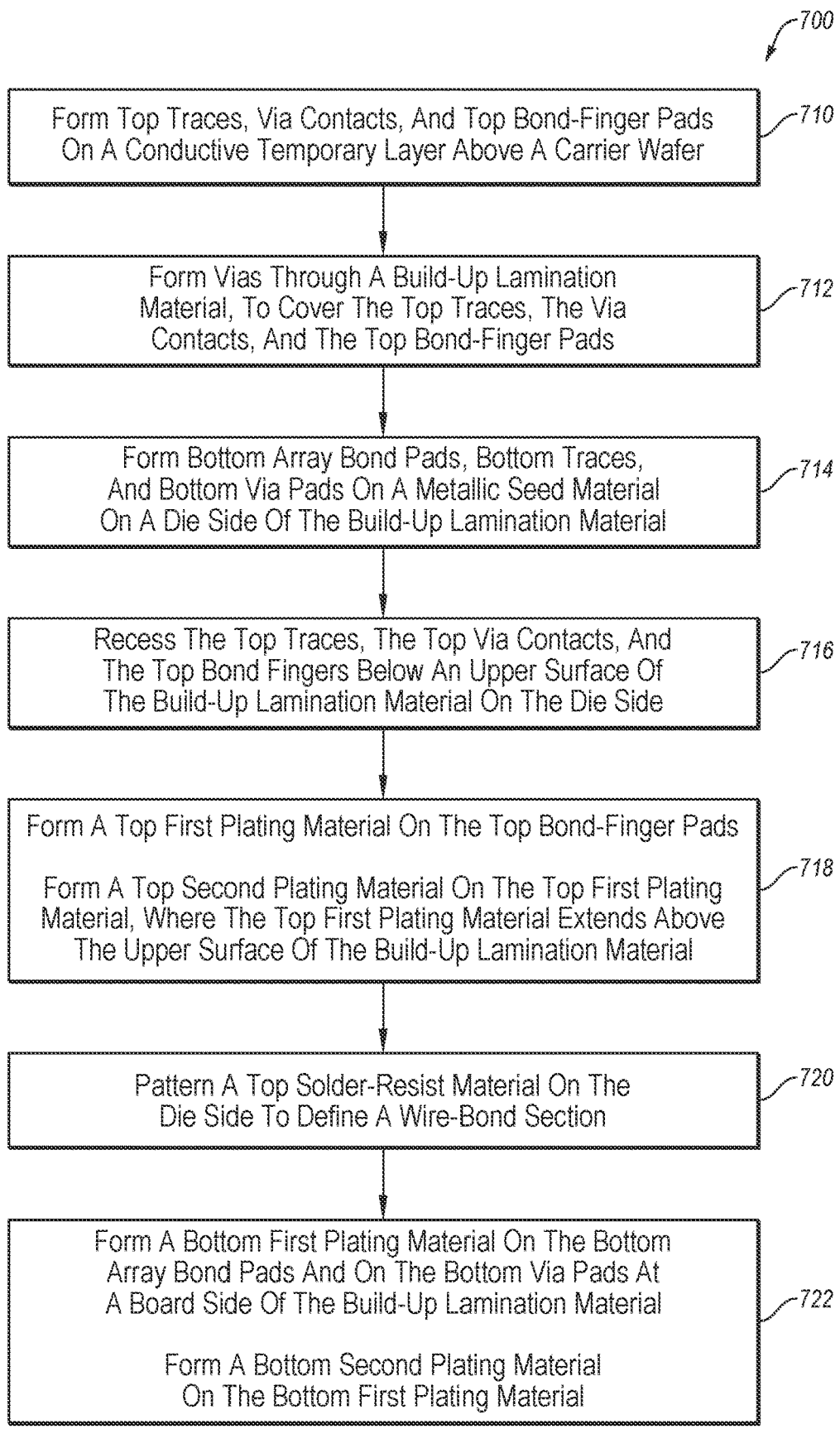
FIGS. 7 and 8 are simplified process flow illustrations of method embodiments illustrated in FIGS. 1A through 2G.

Processing the embedded trace substrate assembly embodiments may be illustrated by reference to FIGS. 7 and 8. FIG. 7 is a simplified process flow illustration of method embodiments for structures and devices illustrated in FIGS. 1A through 2G. Reference numbers from FIGS. 1A through 2G may be seen in the following method embodiment descriptions. A method of forming an embedded trace substrate assembly is disclosed. At 710, the method includes forming top traces 110, via contacts 112, and top bond-finger pads 114 on a conductive temporary layer 104 above a carrier wafer 102. At 712, the method includes forming vias 122 through a build-up lamination material 116, wherein the build-up lamination material 116 covers the top traces 110 and the top bond-finger pads 114. At 714, the method includes forming bottom array bond pads 126, bottom traces 128, and bottom via pads 130 on a metallic seed material 118 at a die side 132 of the build-up lamination material 116, wherein forming the bottom via pads 130 also comprises forming the bottom via pads 130 on the via contacts 112. At 716, the method includes recessing the top traces, the top via contacts 112, and the top bond finger pads 114 below an upper surface 138 of the build-up lamination material 116 at the die side 132. At 718, the method includes forming a top first plating material 144 on the top bond-finger pads 114A, and further comprises forming a top second plating material 146 on the top first plating material 144, wherein the top bond-finger pads 114A have a first lateral dimension, wherein each of the top first plating material 144 and the top second plating material 146 have a second lateral dimension that is less than the first lateral dimension, and wherein the top second plating material 146 extends above the upper surface 138 of the build-up lamination material 116.

At 720, the method further includes patterning a top solder-resist material 150 on the die side 132 to define a wire-bond section 170, wherein the top solder-resist material 150 is laterally set back from at least one top second plating material 146, and wherein patterning the top solder-resist material 150 also covers the top traces 110. At 722, the method further includes forming a bottom first plating material 156 on the bottom array bond pads 126 and on the bottom via pads 130 at a board side 134 of the build-up lamination material 116, wherein the board side 134 is opposite the die side 132; and forming a bottom second plating material 158 on the bottom first plating material 156 at the board side 134, wherein bottom array bond pads 126 and the bottom via pads 130 are spaced apart by a patterned bottom solder-resist material 152, and wherein the patterned bottom solder-resist material 152 covers the bottom traces 128.

Figure 8:
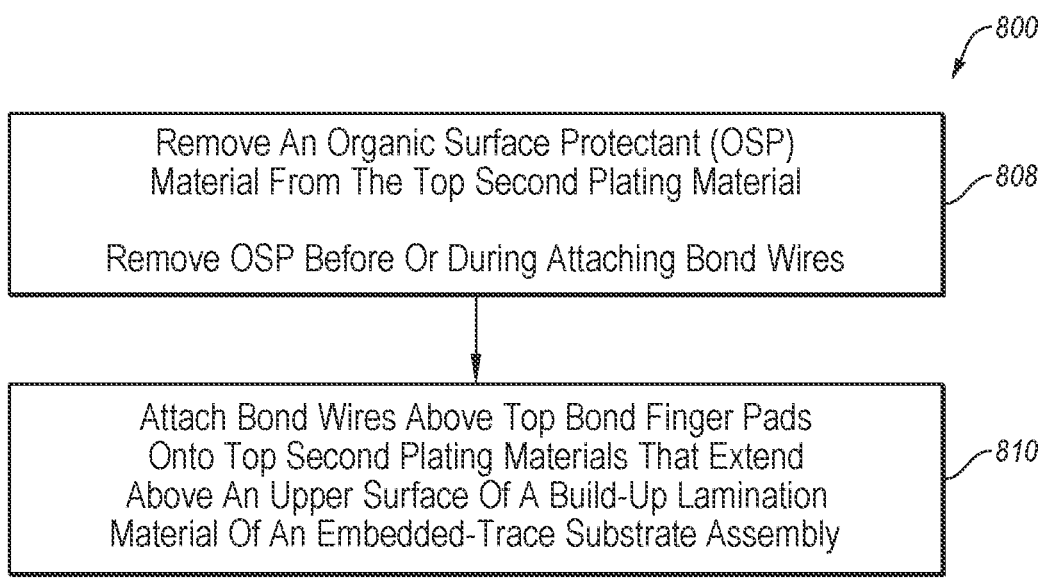

FIG. 8 is a simplified process flow chart for a method of attaching bond wires 162 (e.g., FIGS. 2Fi, 2G and 3). At 810, the method includes attaching bond wires 162 above top bond finger pads 114A, and onto top second plating materials 146, where the top second plating material 146 extends above the upper surface 138 of the build-up lamination material 116, and where the top second plating material 146 has a smaller lateral width the top bond finger pads 114A. At 808, the method may first commence by first either removing an organic surface protectant (OSP) material 160, or by attaching the bond wires 162 while using the OSP material 160 as a protective material during wire bonding.

Disclosed embodiments illustrate miniaturization techniques for substrate assemblies, where bond wire line spacing (L/S) issues of sufficient reduced spacing without bridging between adjacent bond wires are addressed. Also, with miniaturization of substrate assemblies, issues of useful wire bond stitch values are addressed, where useful mechanical pull strength before wire bond failure are disclosed.

Thus, disclosed is an embedded trace substrate assembly, comprising a build-up lamination material comprising: a die side including an upper surface; and a board side opposite the die side; a solder-resist material on the upper surface of the die side of the build-up lamination material; bond-finger pads exposed through the build-up lamination material at the die side and having a first lateral width; a top first plating material on the bond-finger pads, the top first plating material comprising a top surface that is substantially coplanar with the upper surface of the build-up lamination material; a top second plating material on the top first plating material and having a second lateral width less than the first lateral width, the top first plating material including a top surface overlying the upper surface of the die side of the build-up lamination material; and a wire-bond section comprising a row of the bond-finger pads, the top first plating material, and the top second plating material, the solder-resist material set back from a portion of the upper surface of the die side of the build-up lamination material and from the bond-finger pads.

Thus, also disclosed is a microelectronic device assembly, comprising a microelectronic device wire bonded to an embedded trace substrate assembly, the embedded trace substrate assembly comprising: a build-up lamination material comprising: a board side; and a die side opposite the board side and including an upper surface; a solder-resist material on the die side at the upper surface; bond-finger pads exposed through the build-up lamination material at the die side, the bond-finger pads having a first lateral width; a top first plating material on the bond-finger pads and comprising a top surface substantially coplanar with the upper surface of the die side of the build-up lamination material; a top second plating material on the top first plating material and having a second lateral width less than the first lateral width, the top first plating material including a top surface above the upper surface of the die side of the build-up lamination material; a wire-bond section comprising a row of the bond-finger pads, the top first plating material, and the top second plating material, wherein the solder-resist material is only peripherally adjacent the wire-bond section; and bond wires coupling the microelectronic device to the top second plating.

Thus also disclosed is a process of forming an embedded trace substrate assembly, comprising patterning a masking material on an upper surface of a build-up lamination material and a bond-finger pad to form a patterned masking material overlapping a portion of the bond-finger pad, the bond-finger pad having first lateral width; forming a first top plating material on the bond-finger pad to a height of the upper surface of the build-up lamination material; forming a second top plating material on the first top plating material, the second top plating material at least partially above the upper surface of the build-up lamination material and having a second lateral width less that the first lateral width the bond-finger pad; removing the patterned masking material; and forming a top solder resist material on the upper surface to define a wire-bond section, the top solder resist material only peripherally adjacent the wire-bond section.

Thus, also disclosed is an electronic system, comprising an input device; an output device; a processor device operably coupled to the input device and the output device; a memory device operably coupled to the processor device; and an embedded trace substrate assembly, comprising: a build-up lamination material comprising: a die side having an upper surface; and a board side opposite the die side; a solder-resist material on the upper surface of the die side of the build-up lamination material; bond-finger pads exposed through the build-up lamination material at the die side and each having a first lateral width; a top first plating material on the bond-finger pads and having a top surface substantially coplanar with the upper surface of die side of the build-up lamination material; a top second plating material on the top first plating material and having a second lateral width less than the first lateral width of each of the bond-finger pads, the top first plating material having a top surface vertically overlying the upper surface of the die side of the build-up lamination material; and a wire-bond section comprising a row of the bond-finger pads, the top first plating material, and the top second plating material, the solder-resist material set back from a portion of the upper surface and from the bond-finger pads, and the solder-resist material only peripherally adjacent the wire-bond section.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. An embedded trace substrate assembly, comprising:
   a build-up lamination material comprising:
      a die side including an upper surface; and
      a board side opposite the die side;
   a solder-resist material on the upper surface of the die side of the build-up lamination material;
   bond-finger pads exposed through the build-up lamination material at the die side and having a first lateral width;
   a top first plating material on the bond-finger pads, the top first plating material comprising a top surface that is substantially coplanar with the upper surface of the build-up lamination material;
   a top second plating material on the top first plating material and having a second lateral width less than the first lateral width, the top first plating material including a top surface overlying the upper surface of the die side of the build-up lamination material; and
   a wire-bond section comprising a row of the bond-finger pads, the top first plating material, and the top second plating material, the solder-resist material set back from a portion of the upper surface of the die side of the build-up lamination material and from the bond-finger pads.

2. The embedded trace substrate assembly of claim 1, wherein the solder-resist material is only peripherally adjacent the wire-bond section.

3. The embedded trace substrate assembly of claim 1, wherein:
   the top first plating material comprises a nickel material; and
   the top second plating material comprises a gold material.

4. The embedded trace substrate assembly of claim 3, wherein a portion of the top second plating material overlying the upper surface of the build-up lamination material has a height within a range of from about 0.5 μm to about 1.33 μm.

5. The embedded trace substrate assembly of claim 3, wherein the top second plating material and the bond-finger pads have a comparative height ratio within a range of from about 0.03:1 to about 0.08:1.

6. The embedded trace substrate assembly of claim 1, wherein the bond-finger pads are spaced apart by a line-spacing distance within a range of from about 10 μm to about 50 μm.

7. The embedded trace substrate assembly of claim 1, wherein the bond-finger pads are spaced apart by a line-spacing distance, and further comprising bond wires contacting the top second plating material, the bond wires comprising:
   a bond-finger-attach portion physically and metallurgically contacting the top second plating material, the bond-finger-attach portion having a lateral width less than the line-spacing distance.

8. The embedded trace substrate assembly of claim 1, wherein the bond-finger pads are spaced apart by a line-spacing distance, and further comprising bond wires contacting the top second plating material, the bond wires comprising:
a bond-finger-attach portion contacting the top second plating material, the bond-finger-attach portion having a lateral width less than or equal to the second lateral width.

9. The embedded trace substrate assembly of claim 1, further comprising:
traces on the die side and at least partially encapsulated by the solder-resist material;
top via contacts on the die side; and
through-substrate filled vias comprising:
bottom via pad portions on the board side; and
through-substrate portions contacting the top via contacts.

10. A microelectronic device assembly, comprising:
a microelectronic device wire bonded to an embedded trace substrate assembly, the embedded trace substrate assembly comprising:
a build-up lamination material comprising:
a board side; and
a die side opposite the board side and including an upper surface;
a solder-resist material on the die side at the upper surface;
bond-finger pads exposed through the build-up lamination material at the die side, the bond-finger pads having a first lateral width;
a top first plating material on the bond-finger pads and comprising a top surface substantially coplanar with the upper surface of the die side of the build-up lamination material;
a top second plating material on the top first plating material and having a second lateral width less than the first lateral width, the top first plating material including a top surface above the upper surface of the die side of the build-up lamination material; and
a wire-bond section comprising a row of the bond-finger pads, the top first plating material, and the top second plating material, wherein the solder-resist material is only peripherally adjacent the wire-bond section; and
bond wires coupling the microelectronic device to the top second plating material.

11. The microelectronic device assembly of claim 10, wherein:
the top first plating material comprises a nickel material;
the top second plating material comprises a gold material, and a portion of the top second plating material above the upper surface of the die side of the build-up lamination material has a height within a range from about 1 µm to about 3 µm; and
the bond-finger pads are spaced apart by a line spacing distance within a range of from about 10 µm to about 50 µm.

12. The microelectronic device assembly of claim 11, wherein the top second plating material and the bond-finger pads have a comparative height ratio within a range of from about 0.03:1 to about 0.08:1.

13. The microelectronic device assembly of claim 11, wherein the microelectronic device comprises a first wire-bonded memory device wire bonded to a first bond-finger pad row, and further comprising:
a subsequent wire-bonded microelectronic device above the first wire-bonded memory device and wire bonded to a subsequent bond-finger row positioned substantially in parallel with the first bond-finger pad row.

14. The microelectronic device assembly of claim 10, further comprising:
an electrical bump section on the embedded trace substrate assembly and comprising bond-finger pads exposed through the build-up lamination material at the die side, the bond-finger pads having a first lateral width;
a top first plating material on the bond-finger pads and comprising a top surface substantially coplanar with the upper surface of the die side of the build-up lamination material; and
a top second plating material on the top first plating material and having a second lateral width less than the first lateral width, the top first plating material having a top surface above the upper surface of the die side of the build-up lamination material.

15. An electronic system, comprising:
an input device;
an output device;
a processor device operably coupled to the input device and the output device;
a memory device operably coupled to the processor device; and
an embedded trace substrate assembly, comprising:
a build-up lamination material comprising:
a die side having an upper surface; and
a board side opposite the die side;
a solder-resist material on the upper surface of the die side of the build-up lamination material;
bond-finger pads exposed through the build-up lamination material at the die side and each having a first lateral width;
a top first plating material on the bond-finger pads and having a top surface substantially coplanar with the upper surface of the die side of the build-up lamination material;
a top second plating material on the top first plating material and having a second lateral width less than the first lateral width of each of the bond-finger pads, the top first plating material having a top surface vertically overlying the upper surface of the die side of the build-up lamination material; and
a wire-bond section comprising a row of the bond-finger pads, the top first plating material, and the top second plating material,
the solder-resist material set back from a portion of the upper surface and from the bond-finger pads, and
the solder-resist material only peripherally adjacent the wire-bond section.

16. The electronic system of claim 15, wherein:
the memory device is wire-bond coupled to the embedded trace substrate assembly within the wire-bond section; and
the processor device is flip-chip coupled to the embedded trace substrate assembly within an electrical bump section.

17. The electronic system of claim 16, wherein the memory device comprises a first wire-bonded memory device that is wire-bonded to a first row of bond-finger pads, top first plating materials and top second plating materials, further comprising:
a second wire-bonded memory device above the first wire-bonded memory device, the second wire-bonded memory device wire-bonded to a subsequent row of bond-finger pads, top first plating materials, and top second plating materials.

18. The electronic system of claim 16, wherein the memory device comprises a first wire-bonded memory device that is wire-bonded to a first row of bond-finger pads, top first plating materials, and top second plating materials, and further comprising:
 a second wire-bonded memory device above the first wire-bonded memory device, the second wire-bonded memory device wire-bonded to a subsequent row of bond-finger pads, top first plating materials, and top second plating materials; and
 an additional processor device above the processor device and flip-chip coupled to the processor device by way of a through-silicon via in the processor device.

* * * * *